(12) United States Patent
Miyauchi et al.

(10) Patent No.: US 6,192,084 B1
(45) Date of Patent: Feb. 20, 2001

(54) SOFT OUTPUT DECODING APPARATUS AND METHOD FOR CONVOLUTIONAL CODE

(75) Inventors: Toshiyuki Miyauchi, Tokyo; Masayuki Hattori, Kanagawa, both of (JP)

(73) Assignee: Sony Corporation, Tokyo (JP)

( * ) Notice: Under 35 U.S.C. 154(b), the term of this patent shall be extended for 0 days.

(21) Appl. No.: 09/318,584

(22) Filed: May 25, 1999

(30) Foreign Application Priority Data

May 28, 1998 (JP) .................................................. 10-146762
Aug. 25, 1998 (JP) .................................................. 10-238987

(51) Int. Cl.$^7$ .................................................. H04L 23/02
(52) U.S. Cl. ........................ 375/262; 375/265; 375/341; 714/792; 714/794
(58) Field of Search .................................. 375/341, 262, 375/265; 714/791, 792, 794, 795

(56) References Cited

U.S. PATENT DOCUMENTS

| | | | | |
|---|---|---|---|---|
| 5,307,374 | * | 4/1994 | Baier | 375/11 |
| 5,721,746 | * | 2/1998 | Hladik et al. | 371/43 |
| 5,825,832 | * | 10/1998 | Benedetto | 375/341 |
| 5,844,946 | * | 12/1998 | Nagayasu | 375/341 |
| 5,933,462 | * | 8/1999 | Viterbi et al. | 375/341 |

* cited by examiner

*Primary Examiner*—Stephen Chin
*Assistant Examiner*—Dac V. Ha
(74) *Attorney, Agent, or Firm*—Limbach & Limbach L.L.P.

(57) ABSTRACT

A soft output decoding method and apparatus are provided for provided convolutional codes. After computing the number of states times I$\beta$ ($\beta_t \sim \beta_{t-D+1}$) for a truncated length, the soft output outside the truncated length is sequentially computed, as next following I$\beta$ ($\beta_{t-D} \sim \beta_{t-2D+1}$) outside the next following truncated length is computed, at the same time as I$\beta$ of the next truncated length is sequentially computed. In this manner, a decoder performs computation of I$\beta$ within the truncated length and computation of I$\beta$ retrogressive by not less than the truncated length, in parallel processing, as a result of which the computation of I$\beta$ per clock is the number of states x2. This apparatus and method thereby reduces the volume of computation and expedites the decoding.

21 Claims, 31 Drawing Sheets

FIG. 17A $\Gamma\gamma(\beta_1)$

FIG. 17B $\Gamma\gamma(\beta_2)$

FIG. 17C OUTPUT OF REGISTER 506

FIG. 17D OUTPUT OF REGISTER 509

FIG. 17E $I\beta(\lambda)$

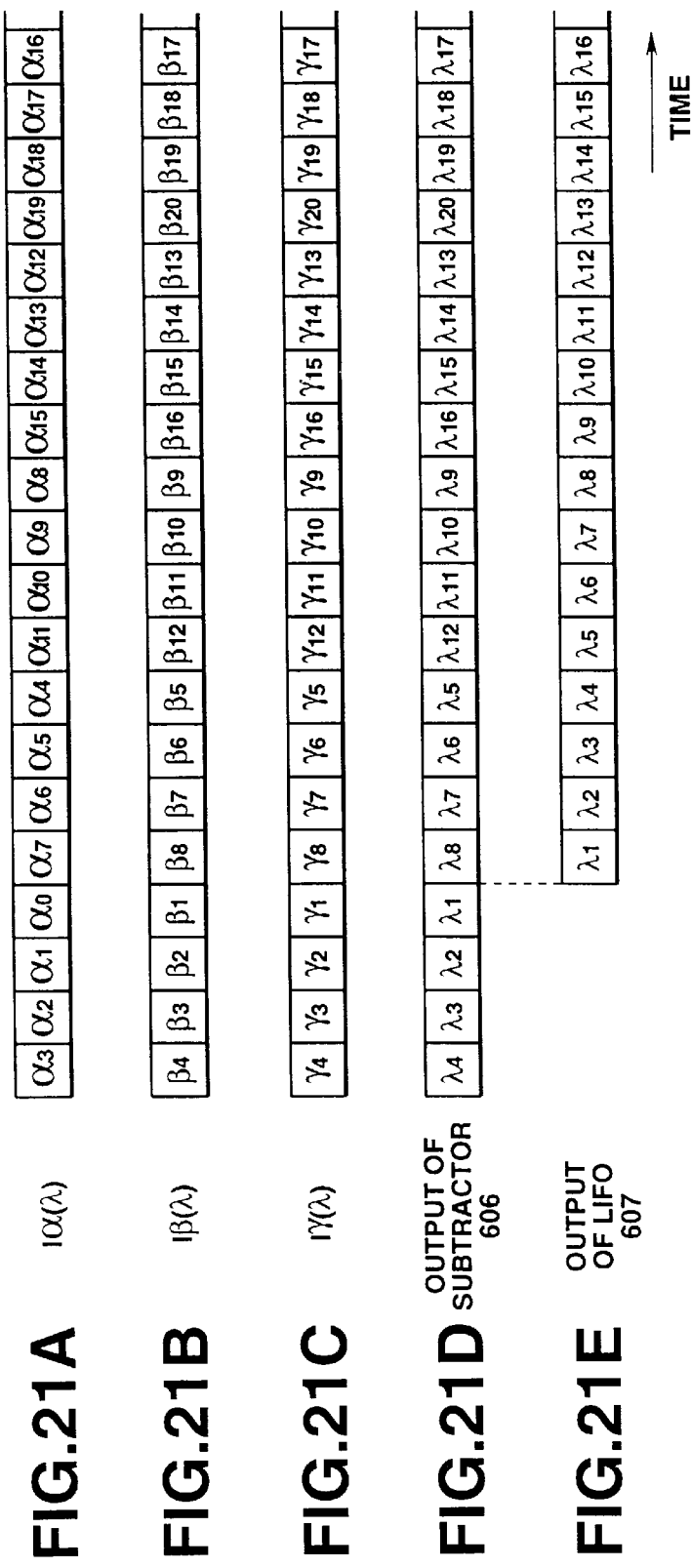

SOFT OUTPUT DECODING APPARATUS AND METHOD FOR CONVOLUTIONAL CODE

BACKGROUND OF THE INVENTION

1. Field of the Invention

This invention relates to a soft output decoding method and apparatus for convolutional codes, applied with advantage to, for example, a satellite broadcast reception device. More particularly, it relates to a soft output decoding device in which the probability information is stored on a recording medium a length not less than a truncated length and in which updating of the probability information within the truncation length and computations of the soft output outside the truncated length are executed in parallel to enable high-speed operations.

2. Description of the Related Art

As a decoding method for minimizing the symbol error ratio following decoding of the convolutional codes, there is known a BCJR algorithm from Bahl, Cocke, Jelinek and Raviv, "Optimal Decoding of Linear Codes for Minimizing Symbol Error Rate", IEEE Trans. Information. Theory, Vol. 1T-20, pp. 284 to 287, March 1974. In the BCJR algorithm, it is not each symbol, but the likelihood of each symbol, that is outputted as the decoding result. This output is termed soft output.

Research is being conducted towards reducing the symbol error rate by using soft outputs as decoded output of the inner code of the conjugated code or as outputs of each reiteration of the iterative decoding method. As a decoding method, suited to this purpose, a BCJR algorithm is stirring up notice.

The contents of the BCJR algorithm are hereinafter explained in detail.

The BCJR algorithm outputs the likelihood of each symbol, instead of outputting each symbol, as a decoding result. The BCJR algorithm is used when convolutional encoding the digital information is convolutional-encoded by a convolutional encoder and the resulting data string obtained on convolutional encoding is observed over a non-storage communication route.

M states (transition states) representing the contents of shift registers of a convolutional encoder are expressed as m(0, 1, . . . M/1). The state at time t is $S_t$, an input at t is $I_t$, an output at time t is $X_t$, and an output sequence is $X_t^{t'}=X_t$, $X_{t+1}$, . . . , $X_{t'}$. The transition probability between respective states $p_t(m\ m')$ is represented by the following equation (1):

$$p_t(m|m')=Pr\{S_t=m|S_{t-1}=m'\} \quad (1)$$

It is noted that Pr{A|} is a conditional probability of occurrence of A, under a condition that an event B has occurred, while Pr{A;B} is a probability of occurrence of both A and B. It is also assumed that the convolutional codes by the convolutional encoder starts with the state $S_0=0$ and outputs $X_1^\tau$ to terminate at $S_\tau=0$.

The noisy non-storage communication route receives an output $X_1^\tau$ as an input and outputs $Y_1^\tau$. It is assumed that an output sequence $Yt^{t'}=Y_t$, $Y_{t+1}$, . . . $Y_{t'}$. Meanwhile, the transition probability of the non-storage communication route can be defined, for all t ($1 \leq t \leq \tau$), by a function $R(\cdot|\cdot)$ satisfying the following equation (2):

$$Pr\{Y_1^t | X_1^t\} = \sum_{j=1}^{t} R(Y_j | X_j) \quad (2)$$

Therefore, if the probability $\lambda_t$ is defined as in the following equation (3):

$$\lambda_t = \frac{Pr\{i_t = 1 | Y_1^\tau\}}{Pr\{i_t = 0 | Y_1^\tau\}} \quad (3)$$

this probability $\lambda_t$ represents the likelihood of the input information at time t when $Y_1^\tau$ is received, such that this probability $\lambda_t$ is the soft output to be found.

The BCJR algorithm defines the probabilities $\alpha_t$, $\beta_t$ and $\gamma_t$ as indicated by the following equations (4) to (6):

$$\alpha_t(m)=Pr\{S_t=m; Y_1^t\} \quad (4)$$

$$\beta_t(m)=Pr\{Y_{t+1}^\tau|S_t=m\} \quad (5)$$

$$\gamma_t(m'm,i)=Pr\{S_t=m;Y_t;i_t=i|S_{t-1}=m'\} \quad (6)$$

The contents of $\alpha_t$, $\beta_t$ and $\gamma_t$ are explained with reference to FIG. 1 which illustrates the relation between the respective probabilities. It is noted that $\alpha_{t-1}$ corresponds to the probability of passing through respective states at time t−1, as computed based on a reception word as from the encoding starting state S0=0, while $\beta_t$ corresponds to the probability of passing through respective states at time T as computed in the reverse sequence to the chronological sequence based on the reception word as from the encoding end state S$\tau$=0, and $\gamma_1$ corresponds to the reception probability of respective branches in transition through respective states at time t as computed based on the reception word and the input probability at time t.

With the aid of $\alpha_t$, $\beta_t$ and $\gamma_t$, the soft output $\lambda_t$ can be represented by the following equation (7):

$$\lambda_t = \frac{\sum_{m=0}^{M-1}\sum_{m'=0}^{M-1} \alpha_{t-1}(m')\gamma_t(m', m, 1)\beta_t(m)}{\sum_{m=0}^{M-1}\sum_{m'=0}^{M-1} \alpha_{t-1}(m')\gamma_t(m', m, 0)\beta_t(m)} \quad (7)$$

It is noted that, for t=1, 2, . . . , $\tau$, the following equation (8) holds:

$$\alpha_t(m) = \sum_{m'=0}^{M-1}\sum_{i=0}^{1} \alpha_{t-1}(m')\gamma_t(m', m, i) \quad (8)$$

where $\alpha_0(0)=1$, $\alpha_0(m)=0 (m \neq 0)$.

Similarly, the following equation (9):

$$\beta_t(m) = \sum_{m'=0}^{M-1}\sum_{i=0}^{1} \beta_{t+1}(m')\chi_{t+1}(m', m, i) \quad (9)$$

holds for t=1, 2, . . . , $\tau$−1, where $\beta_\tau(0)=1$, $\beta_\tau(m)=0$ (m$\neq$0).

For $\gamma_t$, the following equation (10) holds:

$\gamma_t(m', m, i)=P_t(m|m')R(Y_t, X)$ in case of transition from m' to m for an input i (X being its output);

and $\gamma_t(m', m, i)=0$ in case of non-transition from m' to m for the input i  (10)

Based on the above equation, the BCJR algorithm finds the soft output $\lambda_t$ in accordance with the following sequence (a) to (c):

(a) each time $Y_t$ is received, $\alpha_t(m)$, $\gamma_t(m', m, i)$ is computed using the equations (8) and (10);

(b) after reception of the entire sequence $Y_1^\tau$, $\beta_t(m)$ is computed for respective states m for the totality of time points t, using the equation (9); and (c) $\alpha_t$, $\beta_t$ and $\gamma_t$, computed at (a) and (b), are substituted into the equation (7) to compute the soft output $\lambda_t$ at each time point t.

Meanwhile, the above-described BCJR algorithm suffers from the problem that the volume of computation is considerable because of the product computations involved and that continuous data cannot be received because of the necessity of terminating the codes.

In order to combat these problems, a Max-Log-BCJR algorithm and a log-BCJR algorithm have been proposed as techniques for diminishing the computation volume in Robertson, Villebrun and Hoeher, "A Comparison of Optimal and Sub-Optimal MAP Decoding Algorithms Operating in the Domain", in IEEE Int. Cof. On Communications, pp. 1009 to 1013, June 1995, while the SW-BCJR algorithm for performing sliding window processing has been proposed as a technique for receiving continuous data in Benedetto and Montorsi, "Soft-Output Decoding Algorithm in Iterative Decoding of Turbo Codes", TDA Progress Report 42–124, February 1996.

The contents of these algorithms are hereinafter explained.

First, the contents of the Max-Log-BCJR algorithm and the log-BCJR algorithm are explained.

The Max-Log-BCJR algorithm represents the probabilities $\alpha_t$, $\beta_t$ and $\gamma_t$, $\lambda_t$ by a modulo 2 logarithm (natural logarithm) and substitutes the logarithmic sum computations for the product processing of the probabilities, as shown in the following equation (11), while approximating the logarithmic sum computations by the logarithmic maximum value computations, as shown in the following equation (12). Meanwhile, max(x, y) is a function which selects a larger one of x or y.

$$Log(e^x \cdot e^y) = x+y \quad (11)$$

$$Log(e^x + e^y) = max(x, y) \quad (12)$$

For simplifying the explanation, logarithms of $\alpha_t$, $\beta_t$ and $\gamma_t$, $\lambda_t$ are set as $I\alpha_t$, $I\beta_t$, $I\gamma_t$, $I\lambda_t$, respectively, as shown by the following equations (13) to (15):

$$I\alpha_t(m) = log(\alpha_t(m)) \quad (13)$$

$$I\beta_t(m) = log(\beta_t(m)) \quad (14)$$

$$I\gamma_t(m) = log(\gamma_t(m)) \quad (15)$$

where "I" denotes the modulo e logarithm.

In the Max-Log-BCJR algorithm, these $I\alpha_t$, $I\beta_t$, $I\gamma_t$ are approximated as shown by the following equations (16) to (18):

$$I\alpha_t m \cong \max_{i=0,1} \max_{m'}(I\alpha_{t-1}(m') + I\gamma_t(m', m, i)) \quad (16)$$

$$I\beta_t(m) \cong \max_{i=0,1} \max_{m'}(I\beta_{t+1}(m') + (I\gamma_{t+1}(m', m, i)) \quad (17)$$

$$I\gamma_t(m', m, i) = log(P_t(m|m')) + log(R(Y_t, X)) \quad (18)$$

where X is an encoder output on transition from m' to m. It is noted that max m' in $I\alpha_t(m)$ and $I\beta_t(m)$ is to be found in the state m' in which transition to a state m occurs for the input i.

Similarly, $I\lambda_t$ is approximated as shown in the following equation (19), in which max m' in the first term of the right side is to be found in the state m' where transition to the state m exists for the input=1 and in which max m' in the second term is to be found in the state m' where transition to the state m exists for the input=0.

$$I\lambda_t \cong \max_{m=0,\ldots,m-1} \max_{m'}(I\alpha_{t-1}(m') + I\gamma_t(m', m, 1) + I\beta_t(m)) - \quad (19).$$
$$\max_{m=0,\ldots,m-1} \max_{m'}(I\alpha_{t-1}(m') + I\gamma_t(m', m, 0) + I\beta_t(m))$$

Based on the above relation, the Max-Log-BCJR algorithm finds the soft output $\lambda_t$ in accordance with the following sequence (a) to (c):

(a) each time $Y_t$ is received, $I\alpha_t(m)$ and $I\gamma_t(m', m, 1)$ are computed, using the equations (16) and (18);

(b) after receiving the sequence $Y_1^\tau$ in its entirety, $I\beta_t(m)$ is computed, for all states m of all time points t, using the equation (17);

(c) $I\alpha_t$, $I\beta_t$ and $I\gamma_t$, computed in (a) to (c), are substituted into the equation (19) to compute the soft output $I\lambda_t$ at each time point.

Since there are included no product computations in the Max-Log-BCJR algorithm, the processing volume can be reduced significantly in comparison with the BCJR algorithm.

Meanwhile, if the probability sum computation is modified as shown in the following equation (20):

$$Log(e^x + e^y) = max(x, y) + log(1+e^{-|x-y|}) \quad (20)$$

the second term of the right side becomes the linear function for the variable |x-y|, so that, by corresponding tabulation, the logarithmic values of the sum processing can be found correctly.

The Log-BCJR algorithm substitutes the equation (20) for the equation (12) in the Max-Log-BCJR algorithm in its entirety to realize correct probability computations. As compared to the Max-Log-BCJR algorithm, the Log-BCJR algorithm is increased in processing volume. However, there is included no product computation in the Log-BCJR algorithm, such that its output is no other than the logarithmic value of the soft output of the BCJR algorithm except the quantization error.

Since the second term of the right side in the equation (20) is the linear function by the variable |x-y|, it is possible to obtain simple and highly accurate results of computation by, for example, tabulation. Thus, a soft output higher in accuracy can be obtained with the Log-BCJR algorithm than is possible with the Max-Log-BCJR algorithm.

The contents of the SW-BCJR algorithm are hereinafter explained.

In the BCJR algorithm, the code needs to be terminated for $\gamma_t$ computation, such that continuous data cannot be received. The BCJR algorithm accords 1/M for the totality of states as an initial value of $\beta_t$, introduces the truncated length as in the case of Viterbi decoding and finds the soft output by retrograding down the time axis by a truncated length D as set (see FIG. 2).

The SW-BCJR algorithm initializes $\alpha_0$, as in the case of the usual BCJR algorithm, and performs the operations (a) to (e) for each time instant to find the soft output for each time instant.

(a) $\gamma_t$ is found based on the received value at time t and the transition probability;
(b) $\beta_t(m)$ is initialized for the totality of states m so that $\beta_t(m)=1/M$;
(c) $\beta_{t-1}, \ldots, \beta_{t-D}$ are computed based on $\gamma_{t+1}, \ldots, \gamma_t$;
(d) from $\beta_{t-D}$ and $\alpha_{t-D-1}$, as found, the soft output $\lambda_{t-D}$ at time t–D is found by the following equation (21):

$$\lambda_{t-D} = \frac{\sum \alpha_{t-D-1}(m')\gamma_{t-D}(m', m, 1)\beta_{t-D}(m)}{\sum \alpha_{t-D-1}(m')\gamma_{t-D}(m', m, 0)\beta_{t-D}(m)} \quad (21)$$

and (e) from $\alpha_{t-D-1}$ and $\gamma_{t-D}$, $\alpha_{t-D}$ is computed.

In the above-given thesis by Benedetto et al., there are also proposed a SW-Log-BCJR algorithm, combined from the SW-BCJR algorithm and the Log-BCJR algorithm, and a SW-Max-Log-BCJR algorithm, combined from the SW-BCJR algorithm and the Max-Log-BCJR algorithm. It is noted that the SW-Max-Log-BCJR algorithm is referred to in the thesis as SWAL-BCJR algorithm.

With use of the SW-Max-Log-BCJR algorithm or the SW-Log-BCJR algorithm, it is possible to receive continuous data to find a soft output. However, in these algorithms, in contradistinction from the case of decoding terminated codes, it is necessary to find the number of states multiplied by $Y_t$ for the truncated length in order to find one decoded output, with the result that a large processing volume is involved for mounting even though the product computations are not involved.

The SW-Max-Log-BCJR algorithm or the SW-Log-BCJR algorithm has a drawback that, while it is possible to receive the convolutional encoded and transmitted continuous data to find the soft output, the processing volume for producing a code output is increased to render high-speed processing difficult.

On the other hand, with the SW-Log-BCJR algorithm, combined from the SW-BCJR algorithm and the Log-BCJR algorithm, or the SW-Max-Log-BCJR algorithm, combined from the SW-BCJR algorithm and the Max-Log-BCJR algorithm, also termed the SWAL-MAP algorithm, it is possible to diminish the processing volume to find the soft output of continuous data.

However, with these algorithms, it is necessary to retrograde down the time axis by the truncated length D to produce a soft output to find $\beta$ for the number of states times the truncated length D, with the result that a tremendous processing volume is required despite the fact that product processing is not involved in the processing.

SUMMARY OF THE INVENTION

It is therefore an object of the present invention to provide a method and apparatus for decoding a soft output of convolutional codes with a high-speed operation.

It is another object of the present invention to provide a method and apparatus for decoding a soft output of convolutional codes by a simplified structure.

According to the present invention, when finding the probability information at each transition state of the convolutional code, and computing and outputting a soft output using the probability information, the probability information is partitioned in terms of a pre-set truncated length as a unit and stored. The updating of the probability information in the truncated length and the computation of the soft output outside the truncated length are executed in parallel.

According to the present invention, a smaller processing volume per clock or a smaller amount of accessing to the memory suffices to enable a high-speed processing.

Thus, in one aspect of the present invention, there is provided a soft output decoding apparatus for convolutional codes probability computing means for finding the probability information in each transition state of the convolutional codes, probability storage means for storing the probability information as found by the probability computing means in a recording medium, and soft output computing means for finding a soft output using the probability information stored in the recording medium. The probability storage means stores the probability information in an amount not less than a truncated length on the recording medium, and the updating of the probability information within the truncated length by the probability storage means and the computation of the soft output outside the truncated length by the soft output computing means are carried out in parallel.

In another aspect of the present invention, there is provided a soft output decoding method for convolutional codes including a first step of finding the probability information at each transition state of the convolutional codes, a second step of storing the probability information as found in the first step in the recording medium in the first step a length not less than a truncated length, and a third step of finding a soft output using the probability information stored in the recording medium in the second step. The updating of the probability information within the truncated length in the second step and the computation of the soft output outside the truncated length in the third step are carried out in parallel.

BRIEF DESCRIPTION OF THE DRAWINGS

FIG. 17 is a timing chart for illustrating the operation of the register etc making up the Iβ computation storage circuit.

FIG. 21 is a timing chart for illustrating the operation of the soft output computation circuit.

DESCRIPTION OF THE PREFERRED EMBODIMENTS

Figure 1:
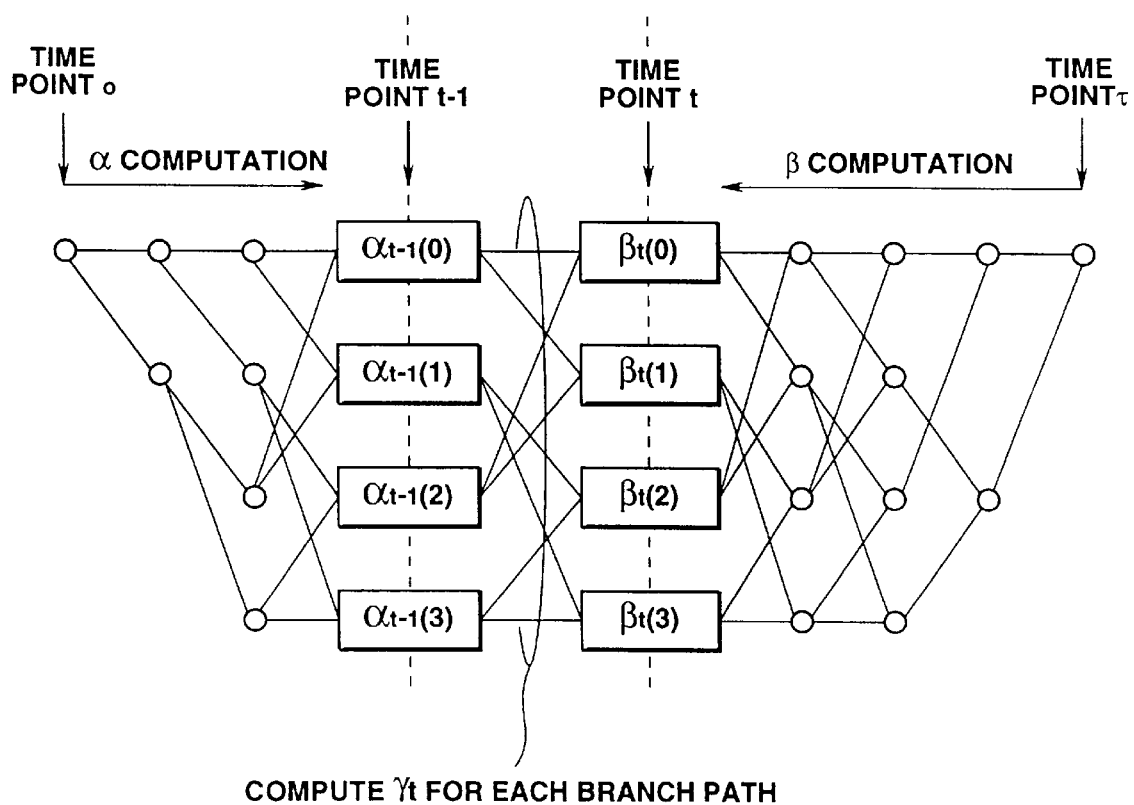
FIG. 1 illustrates the contents of $\alpha_t$, $\beta_t$ and $\gamma_t$ in the BCJR algorithm.
Figure 2:
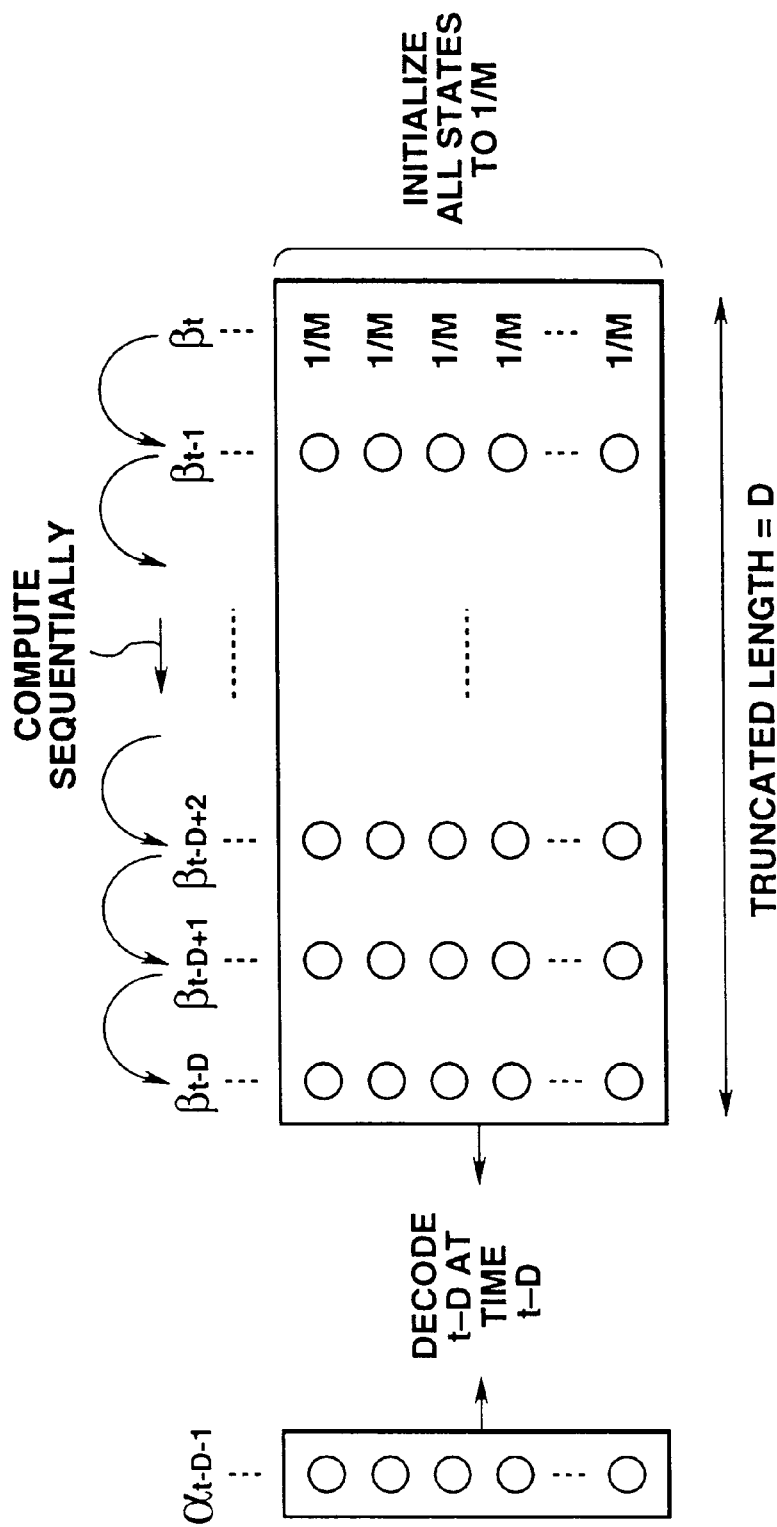
FIG. 2 illustrates the contents of the SW-BCJR algorithm.

Referring to the drawings, preferred embodiments of the present invention will be explained in detail.

Figure 3:
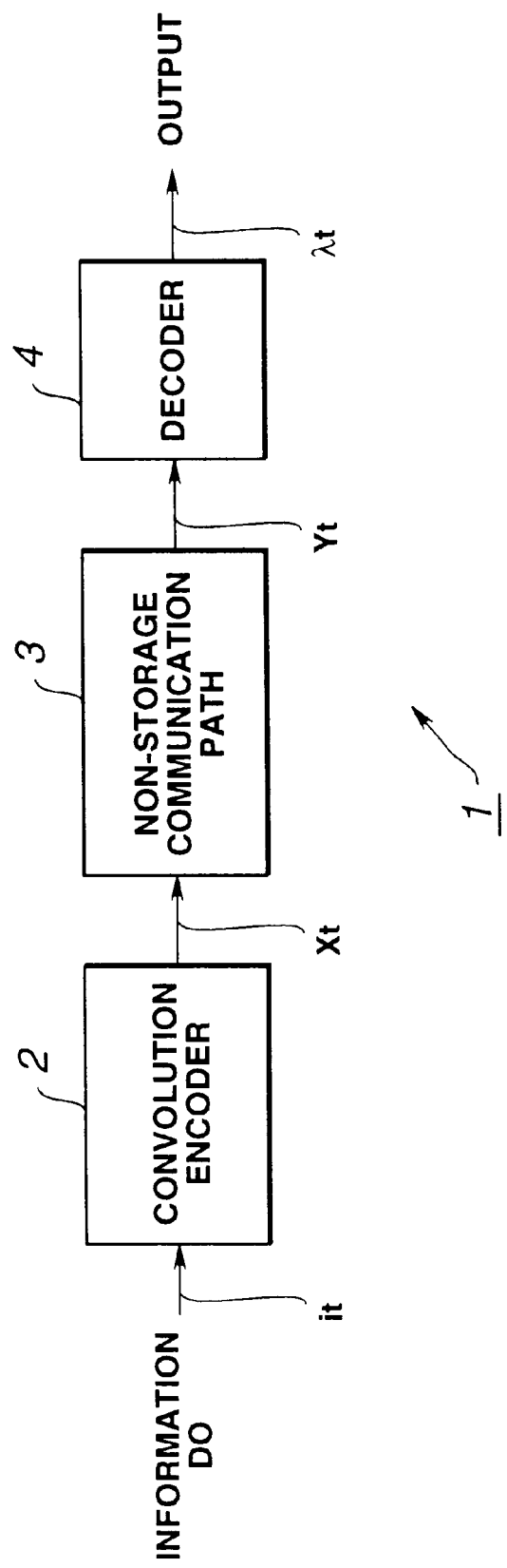
FIG. 3 is a block diagram showing a communication model embodying the present invention.

The present invention is applied to a communication model 1 configured as shown for example in FIG. 3. This communication model 1 convolutionally encodes the digital information DO by a convolutional encoder 2 to send the convolutionally encoded data string to a decoder 4 over a noisy non-storage communication route 3 to decode the soft output of the convolutionally encoded data string.

Figure 4:
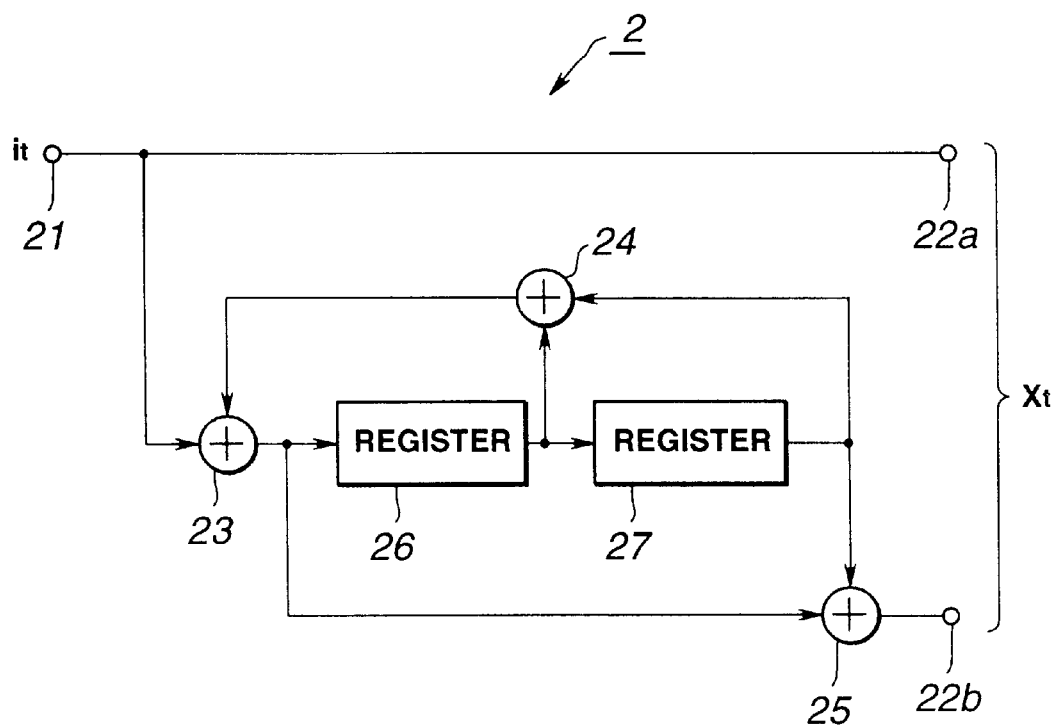
FIG. 4 is a block diagram showing the structure of a convolutional encoder in the communication model.

The convolutional encoder 2 in this communication model 1 is a 1:2 encoder for outputting 2 bits for a 1-bit input. Referring to FIG. 4, the convolutional encoder 2 is made up of an input terminal 21, fed with a 1-bit input $i_t$, output terminals 22a, 22b outputting a 2-bit output $X_t$, three exclusive-OR circuits (EX-OR circuits) 23 to 25 and two registers 26, 27.

The input terminal 21 is connected to the output terminal 22a and to an input side of the EX-OR circuit 23, an output of which is connected to the input side of the resistor 26 and to the input side of the EX-OR circuit 24. An output side of the EX-OR circuit 24 is connected to the output terminal 22b, while an output side of the register 26 is connected to an input side of the register 27 and to an input side of the EX-OR circuit 25. An output of the register 27 is connected to the input of the EX-OR circuit 24 and to an input of the EX-OR circuit 25, an output side of which is connected to the input side of the EX-OR circuit 23.

In this convolutional encoder 2, the 1-bit input $i_t$, sent to the input terminal 21, is directly outputted at the output terminal 22a, while being inputted to the EX-OR circuit 23. The EX-OR circuit 23 sends an exclusive-OR output between the input $i_t$ and the output of the EX-OR circuit 24 via register 26 and registers 26, 27 to the EX-OR circuit 25. An exclusive-OR output of the EX-OR circuit 24 is fed back to the EX-OR circuit 23. This EX-OR circuit 23 also routes the exclusive-OR output between the input $i_t$ and the output of the EX-OR circuit 25 directly and also via the register 26, 27 to the EX-OR circuit 25. The EX-OR circuit 25 outputs an exclusive-OR output between the exclusive-OR output of the EX-OR circuit 23 and an output of the register 27 as another bit at the output terminal 22b.

Figure 5:
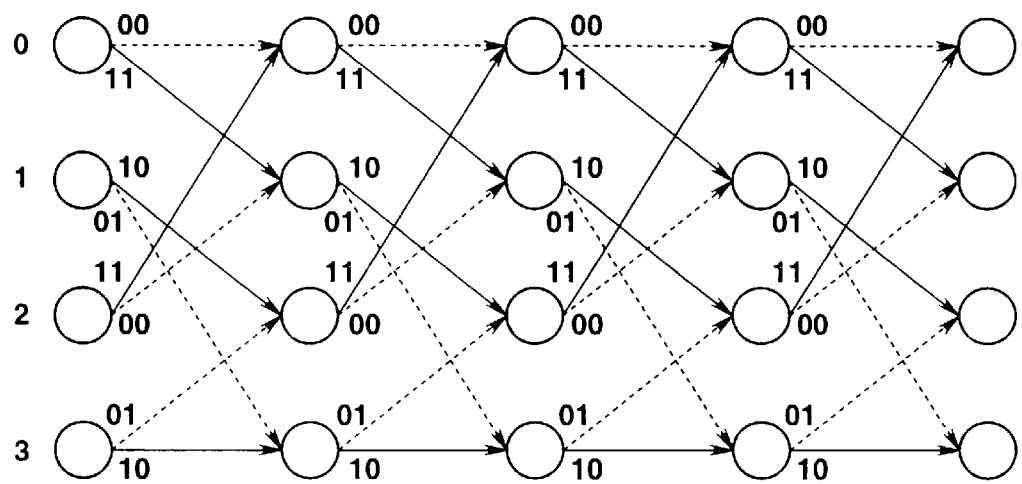
FIG. 5 shows the trellis of the convolutional encoder.

In the above-described configuration of the convolutional encoder 2, if the 1-bit input $i_t$ is routed to the input terminal 21, a 2-bit output sequence $X_1$ is outputted at the output terminals 22a, 22b. FIG. 5 shows the trellis of the convolutional encoder 2, with the number of states being 4.

The decoder 4 in his communication model 1 is a decoder which is based on the SW-Max-Log-BCJR algorithm and which is associated with the convolutional encoder 2 having a constraint length of 3 shown in FIG. 4.

Figure 6:
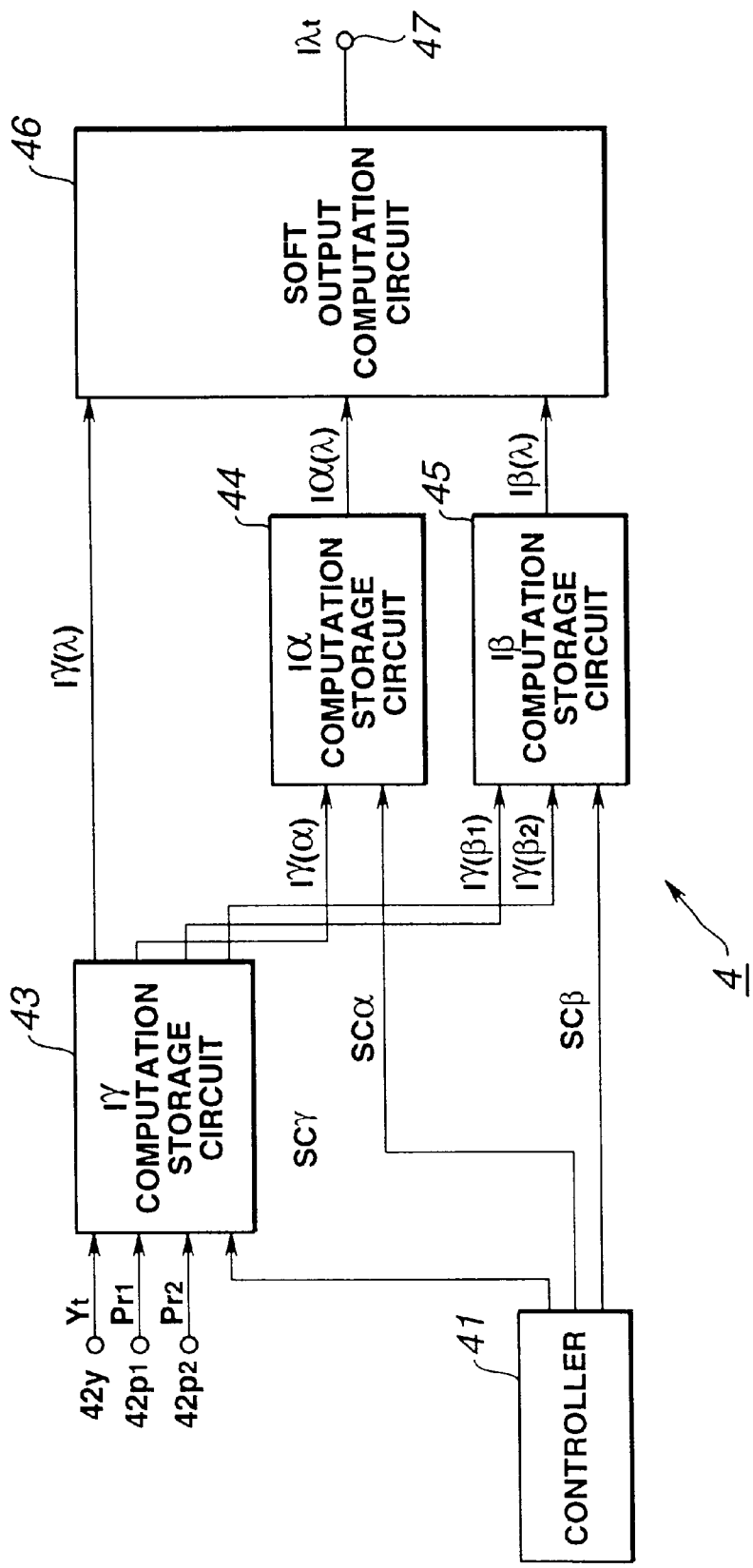
FIG. 6 is a block diagram showing the structure of a decoder in the communication model.

This decoder 4 processes a received value $Y_t$ of the encoder 2, received from the non-storage communication route 3, with a truncated length D=4, to output a soft output $\lambda_t$. Referring to FIG. 6, the decoder 4 includes a controller 41 for controlling the entire operation, input terminals 42y, 43p1 and 42p2, fed with the received value $Y_t$, a priori probability value $Pr_1=\log Pr\{i_t=0\}$ and $Pr_2=\log Pr\{i_t=1\}$, respectively, an Iγ computing circuit 43, an Iα computation storage circuit 44, an Iβ computation storage circuit 45, a soft output computation circuit 46 and an output terminal 47 for outputting a soft output $I\lambda_t$.

Figure 7:
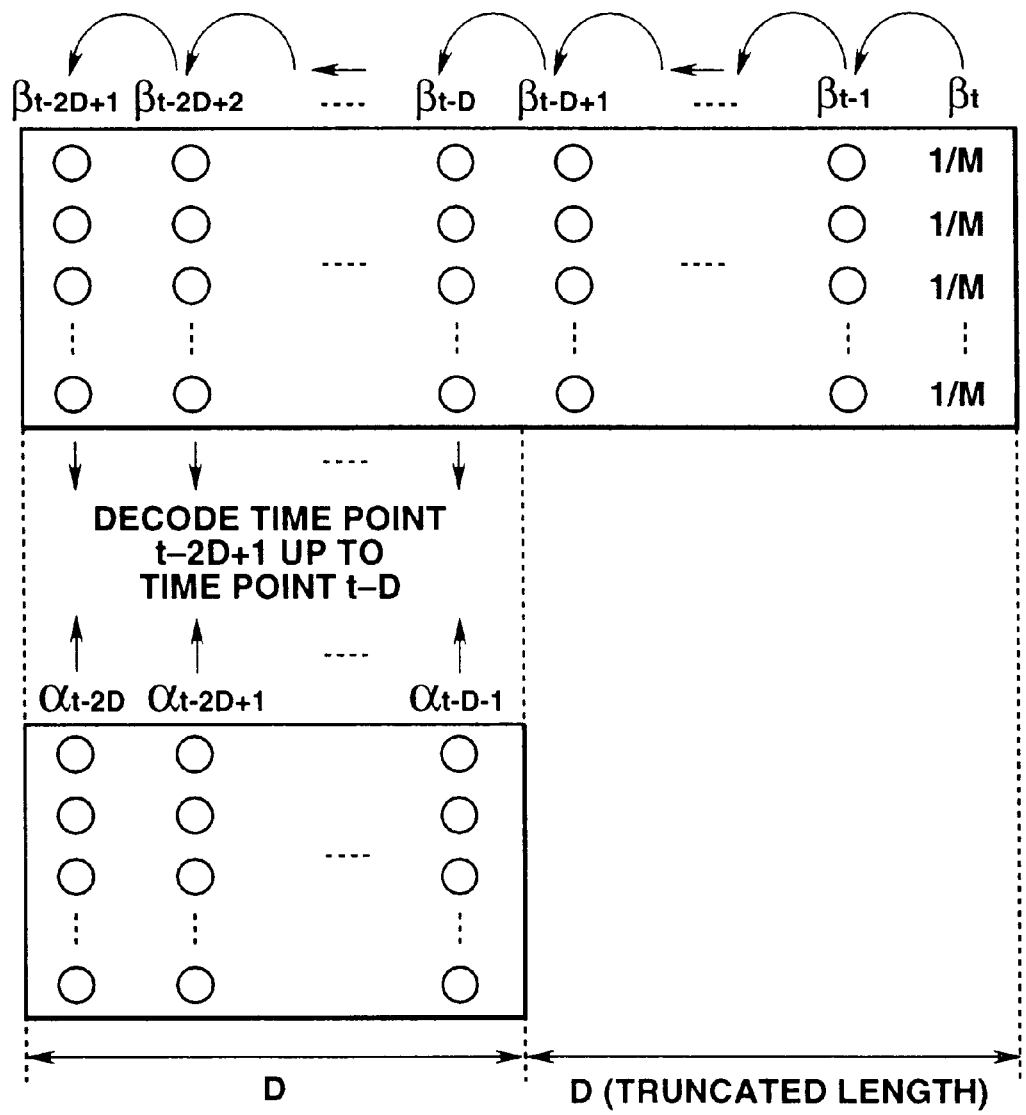
FIG. 7 illustrates the sequence of soft output computation in the communication model.

In contradistinction from the usual SW-Max-Log-BCJR algorithm, this decoder 4 does not compute $I\beta_t$ for the number of states×truncated length for decoding for one time juncture. That is, the decoder 4 computes Iβ (shown by $\beta_t \sim \beta_{t-D+1}$ in FIG. 7), then sequentially computes soft output outside the truncated length, as it computes Iβ outside the truncated length (shown by $\beta_{t-D} \sim \beta_{t-2D+1}$), and sequentially computes Iβ for the next truncated length. Thus, the decoder 4 performs, in parallel, the computation of Iβ in the truncated length and Iβ retrogressive down the time axis by not less than the truncated length, with the computation of Iβ per clock being the number of states×2.

The Iγ computation storage circuit 43 is fed from the controller 41 with a control signal Scγ and with the received value $Y_t$, a priori probability values $Pr_1$, $Pr_2$, from the input terminals 42y, 43p1 and 42p2, respectively. The Iγ computation storage circuit 43 uses the received value $Y_t$, and a priori probability values $Pr_1$, $Pr_2$ to compute and store Iγ in accordance with the equation (18) every received value $Y_t$. The Iγ computation storage circuit 43 then routes Iγ to the computation storage circuit 44 and Iβ to the computation storage circuit 45 and to the soft output computation circuit 46 in a sequence proper for respective processing operations.

The Iγ computation storage circuit 43 operates as first computation means for computing the first probability γ as determined by the code pattern and by the received value. It is noted that Iγ sent from the Iγ computation storage circuit 43 to the Iα computation storage circuit 44 is depicted as Iγ(α), Iγ sent from the Iγ computation storage circuit 43 to the Iβ computation storage circuit 45 is depicted as Iγ(β$_1$), Iγ(β$_2$) whilst Iγ sent from the Iγ computation storage circuit 43 to the soft output computation circuit 46 is depicted as Iγ(λ).

The Iα computation storage circuit 44 is fed from the controller 41 with a control signal Scα, while being fed from the Iγ computation storage circuit 43 with Iγ(α). This Iα computation storage circuit 44 computes and stores Iα, in accordance with the equation (16), using Iγ(α), to route this Iγ(α) to the soft output computation circuit 46 in a sequence proper to the processing. The Iα computation storage circuit 44 operates as second computing means for computing the second probability Iα from the encoding starting state chronologically to each state from one received value $Y_t$ to another. Meanwhile, Iα sent from the Iα computation storage circuit 44 to the soft output computation circuit 46 is depicted as Iγ(λ), while Iγ sent to the Iα computation storage circuit 44 is depicted as Iγ(α).

The Iβ computation storage circuit 45 is fed from the controller 41 with the control signal Scβ, while being fed from the Iγ computation storage circuit 43 with Iγ(β$_1$) and Iγ(β$_2$). There is a time shift of the truncation length×2 between Iγ(β$_1$) and Iγ(β$_2$). The Iβ computation storage circuit 45 uses Iγ(β$_1$) and Iγ(β$_2$) to compute and store two sequences of Iβ in parallel, in accordance with the equation (17), to send one of the sequences of Iβ to the soft output computation circuit 46 in an order proper to the processing. This Iβ computation storage circuit 45 constitutes third computing means for computing the third probability Iβ from the truncated state to each state in a reverse sequence to the chronological sequence from one received value Yt to another. Meanwhile, Iβ sent from the Iβ computation storage circuit 45 to the soft output computation circuit 46 is termed Iβ(γ).

The soft output computation circuit 46 is fed from the Iγ computation storage circuit 43 with Iγ(λ), while being fed from the Iα computation storage circuit 44 and the Iβ computation storage circuit 45 with Iα(λ) and Iβ(λ), respectively. The soft output computation circuit 46 uses Iγ(λ), Iα(λ) and Iβ(λ) to compute Iλt in accordance with the equation (19) to chronologically re-array and output the Iγ(λ), Iα(λ) and Iβ(λ).

The specified structures of the Iγ computation storage circuit 44, Iα computation storage circuit 44, Iβ computation storage circuit 45 and the soft output computation circuit 46 are now explained.

Figure 8:
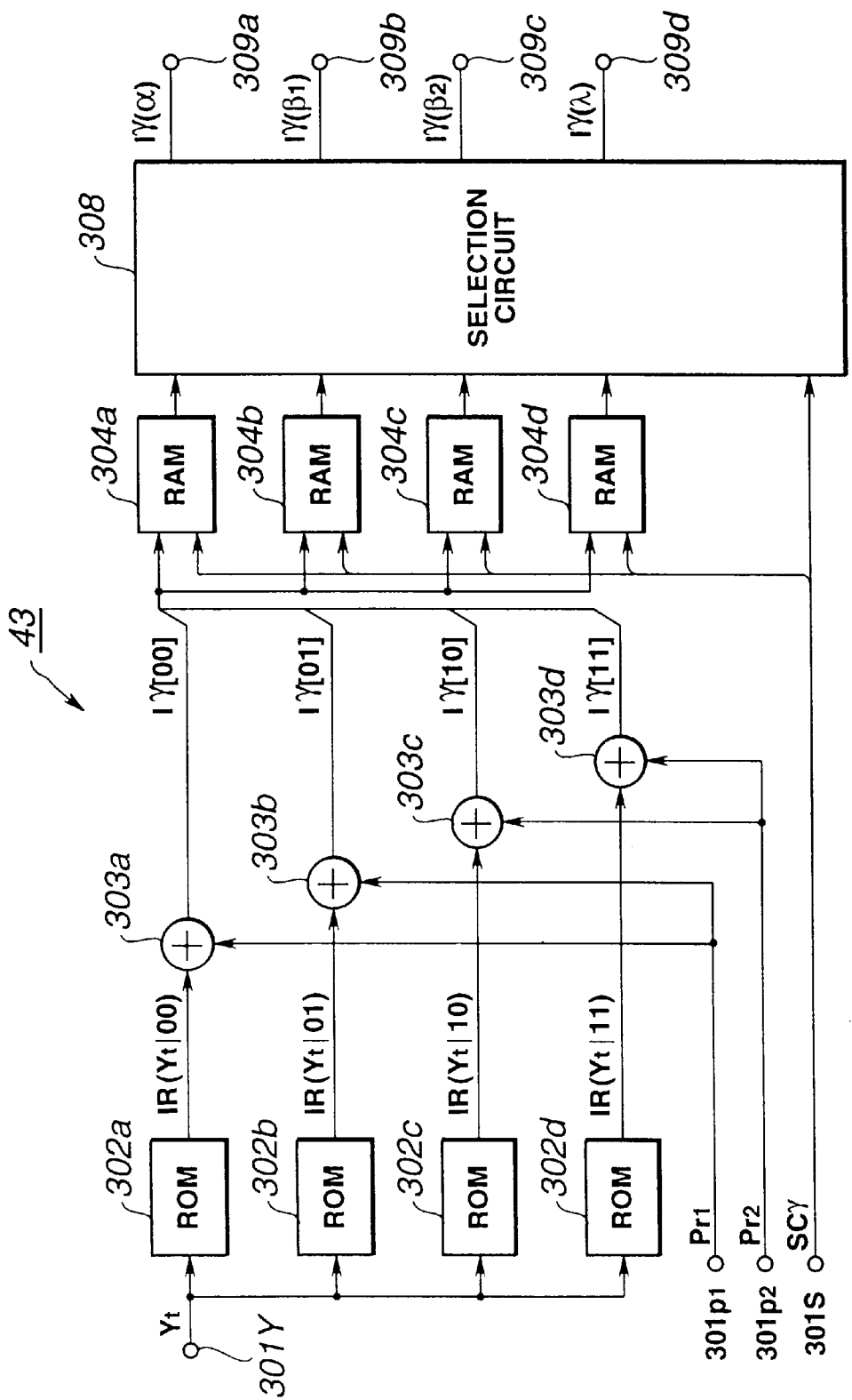
FIG. 8 is a block diagram showing the structure of an Iγ computation storage circuit in the decoder shown in FIG. 6.

FIG. 8 shows the structure of the Iγ computation storage circuit 43. This Iγ computation storage circuit 43 includes input terminals 301Y, 301P$_1$, 301P$_2$ and 301S, fed with the received value $Y_t$, a priori probability values Pr$_1$, Pr$_2$ and with the control signal Scγ, respectively, and read-only memories (ROMs) 302a to 302d constituting a table for outputting the probability IR($Y_t$|00), IR($Y_t$|01), IR($Y_t$|10) and IR($Y_t$|11) of the received value $Y_t$ for respective states m, with the received value $Y_t$ to the input terminal 301Y as a readout address signal.

The Iγ computation storage circuit 43 includes adders 303a and 303b for summing the a priori probability information Pr1 supplied to the input terminal 301P$_1$ for the probabilities IR($Y_t$|00) and IR($Y_t$|01) outputted by the ROMs 302a and 302b to obtain the probabilities Iγ[00] and Iγ[01] of respective branches associated with outputs [00] and [01] on the trellis, and adders 303c and 303d for summing the a priori probability information Pr1 supplied to the input terminal 301P$_2$ for the probabilities IR($Y_t$|10) and IR($Y_t$|11) outputted by the ROMs 302c, 302d to obtain the probabilities Iγ[10], Iγ[11] of respective branches associated with outputs Iγ[10] and [11] on the trellis.

The total number of bits of the respective probabilities Iγ[00] to Iγ[11] outputted by the adders 303a to 303d is the number of bits×2n in the case of the systematic convolutional code with the code rate of k/n. Thus, the Iγ computation storage circuit 43 sets the respective probabilities Iγ[00] to Iγ[11] with 4 bits and outputs the probabilities Iγ[00] to Iγ[11] wit a sum total of 16 bits.

The Iγ computation storage circuit 43 also includes: random access memories (RAMs) 304a to 304d, adapted for sequentially storing the respective probabilities Iγ[00] to Iγ[11], outputted by the adders 303a to 303d, in accordance with the control signal Scγ and for outputting the respective probabilities in a pre-set sequence; a selection circuit 308 for selectively retrieving Iγ outputted by these RAMs 304a to 304d in accordance with the control signal γ for conversion to Iγ(α) Iγ(β$_1$), Iγ(β$_2$) and Iγ(λ); and output terminals 309a to 309d for outputting Iγ(α) Iγ(β$_1$), Iγ(β$_2$) and Iγ(λ).

In the Iγ computation storage circuit 43, the probabilities IR($Y_t$|00), IR($Y_t$|01) IR($Y_t$|10), IR($Y_t$|11) of received values $Y_t$ for respective states n are outputted from the ROMs 302a to 302d from one received value $Y_t$ to another, such that Iγ[00], Iγ[01], Iγ[10] and Iγ[11] of respective branches associated with the outputs [00], [01], [10] and [11] on the trellis are obtained from the adders 303a to 303d. These probabilities Iγ[00] to Iγ[11] are sequentially stored in the RAMs 304a to 304d and read out in a pre-set sequence so as to be retrieved by the selection circuit 308 as Iγ(α), Iγ(β$_1$), Iγ(β$_2$) and Iγ(γ).

Figure 9:
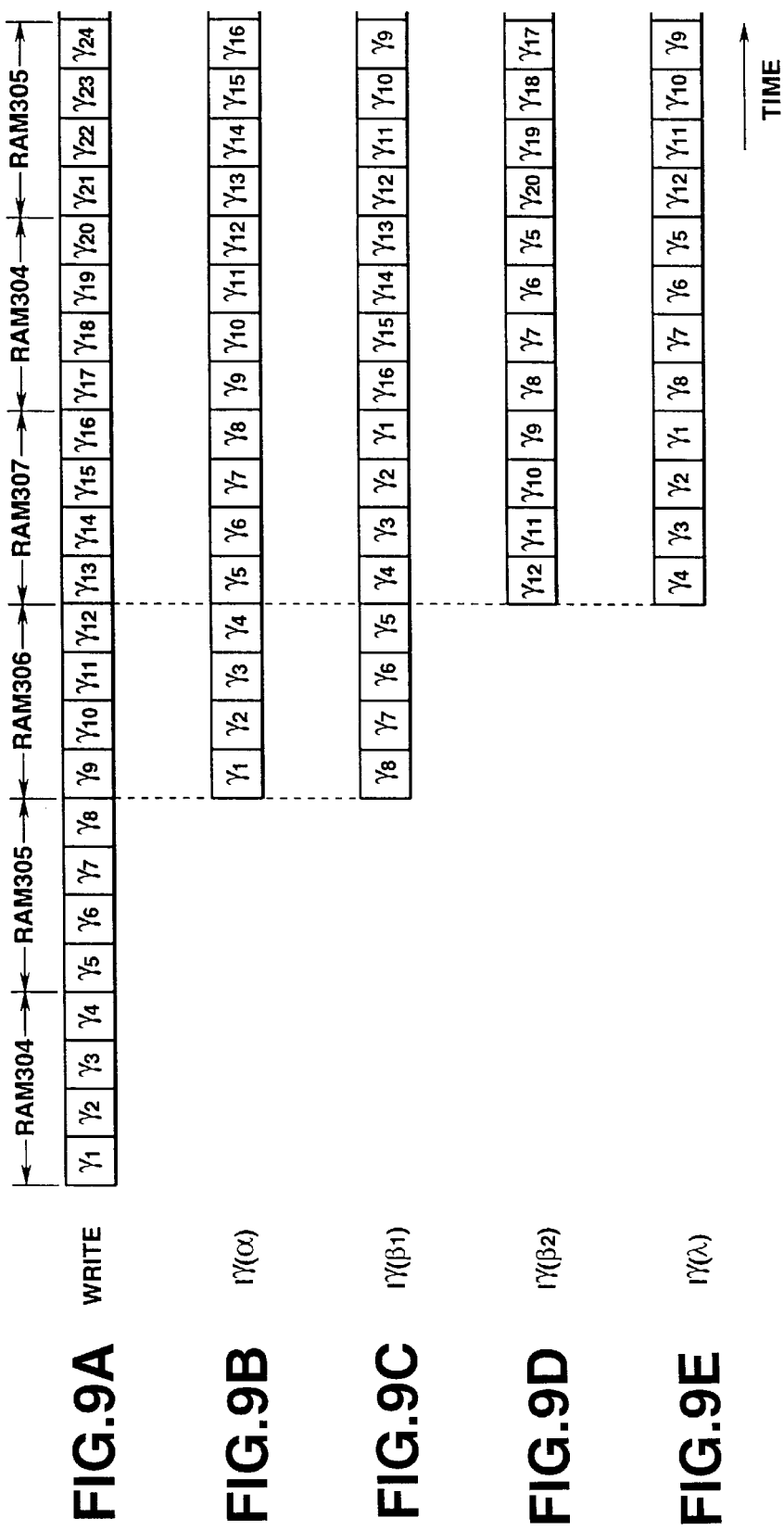
FIG. 9 is a timing chart for illustrating the operation of a RAM constituting the Iγ computation storage circuit.

FIG. 9 is a timing chart showing the management of RAMs 304a to 304d. The four RAMs 304a to 304d are run in a bank configuration, having a recording capacity of 16 bits×4 words, for storing the output data Iγ[00] to Iγ[11] of the adders 303a to 303d, in an amount corresponding to the truncated length D. The RAMs 304a to 304d thus store the probabilities Iγ[00] to Iγ[11] sequentially and cyclically (FIG. 9A). In FIG. 9, the probabilities Iγ[00] to Iγ[ 11] at time points t=1,2,3, . . . are depicted by γ1, γ2, γ3, . . . .

From the RAMs 304a to 304d, the probabilities Iγ[00] to Iγ[11] are read out with a delay corresponding to the time equal to twice the truncated length D, or 2D. From the selection circuit 308, these probabilities Iγ[00] to Iγ[11] are retrieved as the probability Iγ(α) to be sent to the Iα computation storage circuit 44.

The operation of reading out the probabilities Iγ[00] to Iγ[11] for 2D, directly since the end of writing of the probabilities Iγ[00] to Iγ[11] in the RAMs 304a and 304b, in a reverse sequence to the writing sequence, and the operation of reading out the probabilities Iγ[00] to Iγ[11] for 2D, directly since the end of writing of the probabilities Iγ[00] to Iγ[11] in the RAMs 304c and 304d, in a reverse sequence to the writing sequence, are effected alternately. From the selection circuit 308, the probabilities Iγ[00] to Iγ[11], thus read out, are retrieved as the probability Iγ(β$_1$) to be supplied to the Iβ computation storage circuit 45 (FIG. 9C).

On the other hand, the operation of reading out the probabilities Iγ[00] to Iγ[11] for 2D, directly since the end of writing of the probabilities Iγ[00] to Iγ[11] in the RAMs 304b and 304c, in a reverse sequence to the writing sequence, and the operation of reading out the probabilities Iγ[00] to Iγ[11] for 2D, directly since the end of writing of the probabilities Iγ[00] to Iγ[11] in the RAMs 304d and 304a, in a reverse sequence to the writing sequence, are effected alternately. From the selection circuit 308, the probabilities Iγ[00] to Iγ[11], thus read out, are retrieved as the probability Iγ($\beta_2$) to be supplied to the Iβ computation storage circuit 45 (FIG. 9D).

After lapse of 2D since the writing of the probabilities Iγ[00] to Iγ[11] for one truncated length D in the RAMs 304a to 304d, these probabilities Iγ[00] to Iγ[11] are read out in the reverse order to the writing order. From the selection circuit 308, these probabilities Iγ[00] to Iγ[11] are retrieved as the probability Iγ($\lambda$) to be supplied to the soft output computation circuit 46 (FIG. 9E).

Figure 10:
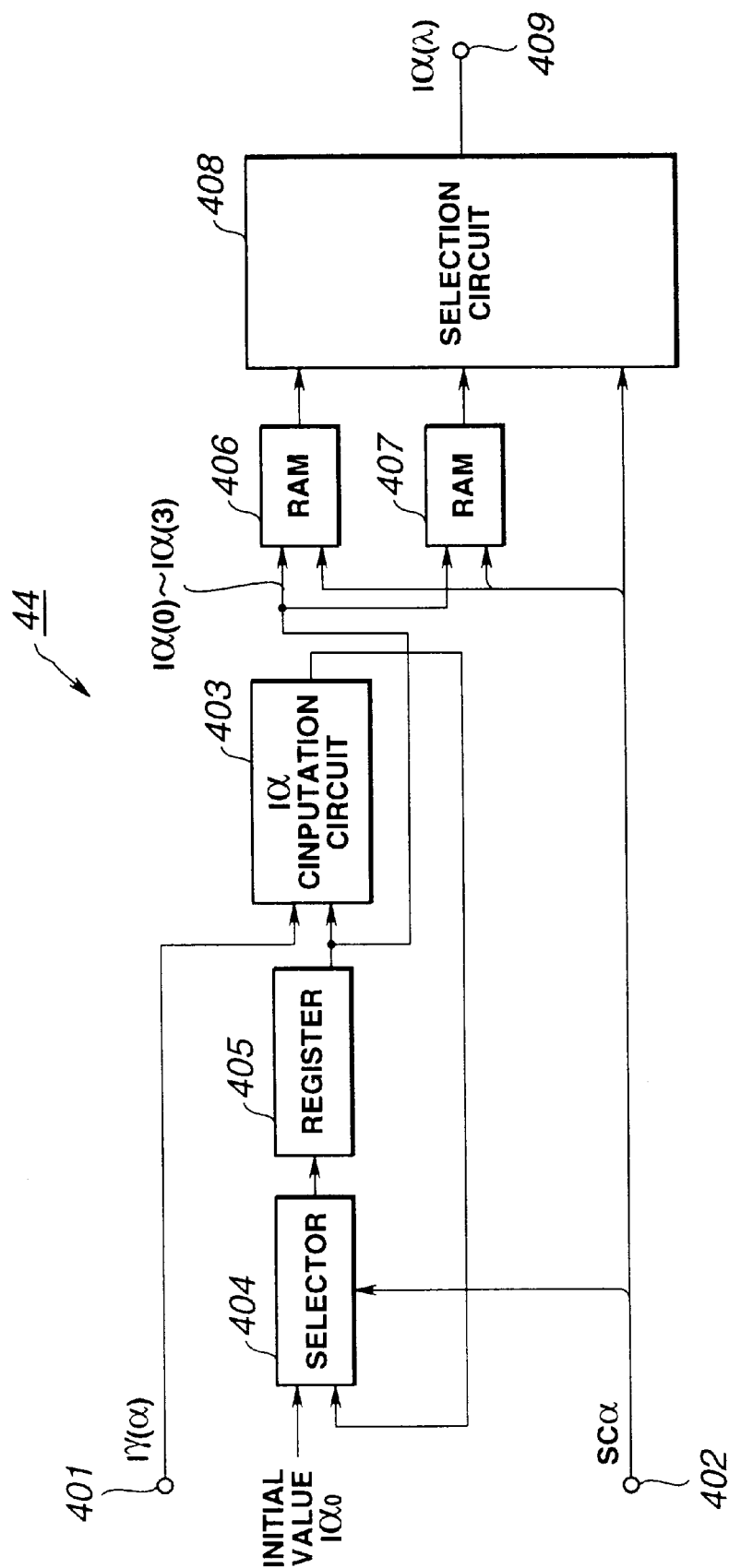
FIG. 10 is a block diagram showing the structure of the Iα computation storage circuit in the decoder shown in FIG. 6.

FIG. 10 shows the configuration of the Iα computation storage circuit 44. This Iα computation storage circuit 44 includes input terminals 401, 402, fed with the probability Iγ($\alpha$) and with the control signal Scγ, respectively, an Iα computing circuit 403 for computing Iα in accordance with the equation (16), using the probability Iγ($\alpha$) one time point ahead as set on a register 405, and a selector 404 for selecting Iα outputted by the Iα computing circuit 403 or the initial value Iα$_0$ to set the selected value in the register 405.

The selector 404 selects the initial value Iα$_0$ only at the time of initialization, based on the control signal Scγ, while selecting output data of the Iα computing circuit 403 at other time points. This initialization occurs at a time point before the time of beginning of the outputting of the probability Iγ($\alpha$) by the Iγ computation storage circuit 43. As for the initial value Iα$_0$, log 1 (=0) and log 0(=$-\infty$) are given as the value at the state 0 and as the value for other states, respectively, if the start point of the encoding is known on the part of a receiver. If the start point of the encoding is not known on the part of a receiver, log 1/M, herein log ¼, is given for all states if definition is to be followed. In actuality, the same value may be used for all states, such that 0 may be given to all states, as an example.

Figure 11:
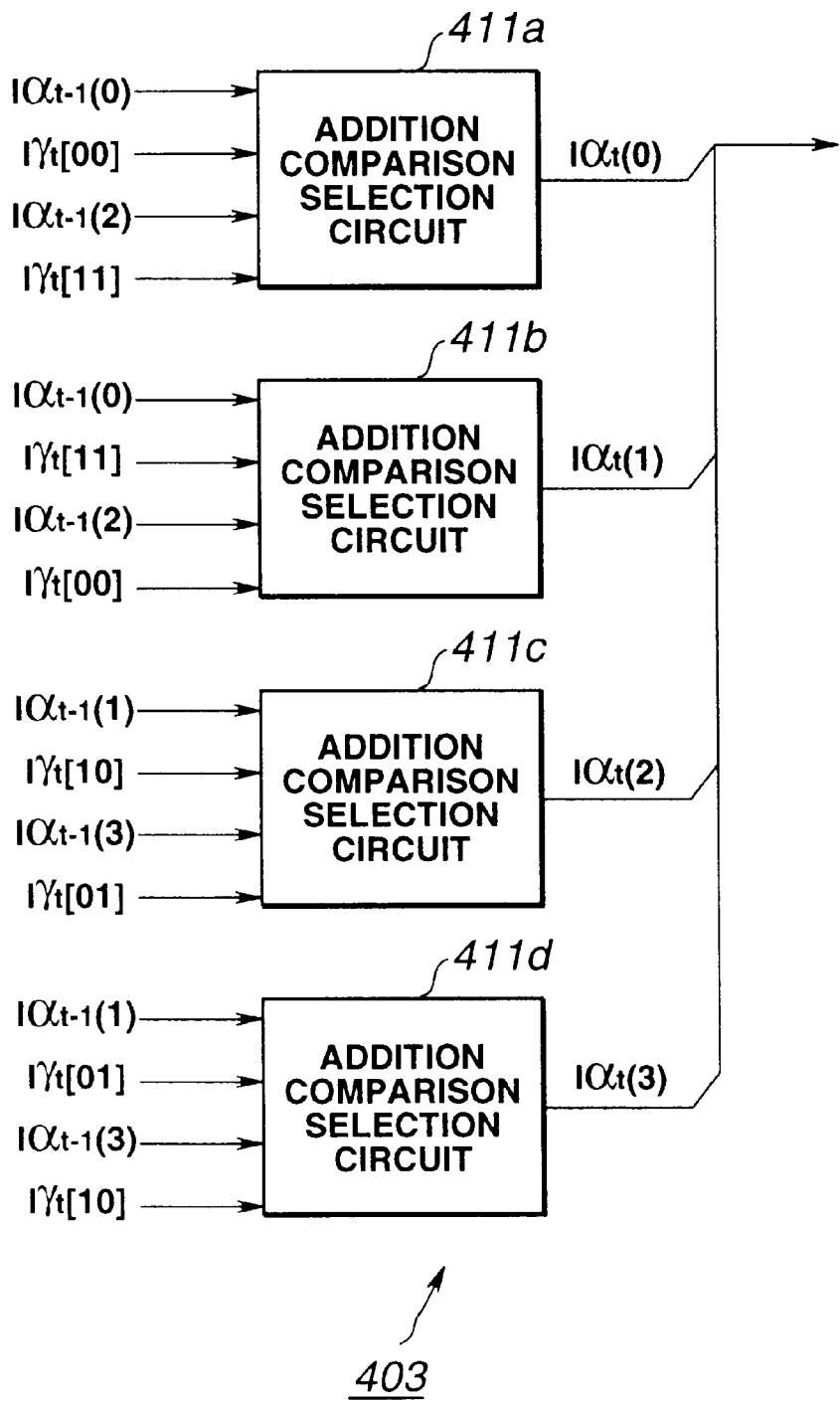
FIG. 11 is a block diagram showing the structure of an Iα computation circuit in the Iα computation storage circuit.

FIG. 11 shows the structure of the Iα computing circuit 403 including four addition comparison selection circuits 411a to 411d. Iγ$_t$[00] to Iγ$_t$[11] and Iα$_{t-1}$[0] to Iα$_{t-1}$[3] one time point ahead are distributed to the addition comparison selection circuits 411a to 411d based on the transitions on the trellis. Each addition comparison selection circuit 411a to 411d selects a larger one of two results of adding Iα and Iγ to find Iα in each state at the next time point.

The addition comparison selection circuit 411a is fed with Iγ$_t$[00] and Iγ$_t$[11], while being fed with Iγ$_{t-1}$[0] and Iγ$_{t-1}$[2], to compute the probability Iαt(0) for the state 0. The addition comparison selection circuit 411b is fed with Iγ$_t$[11] and Iγ$_t$[00], while being fed with Iγ$_{t-1}$[2], to compute the probability Iαt(1) for the state 1.

The addition comparison selection circuit 411c is fed with Iγ$_t$[10] and Iγ$_t$[01], while being fed with Iα$_{t-1}$[1] and Iα$_{t-1}$[3], to compute the probability Iα(2) for the state 2. The addition comparison selection circuit 411d is fed with Iγ$_t$[01] and Iγ$_t$[10], while being fed with Iγ$_{t-1}$[1]and Iγ$_{t-1}$[3], to compute the probability Iα$_t$(3) for the state 3.

Figure 12:
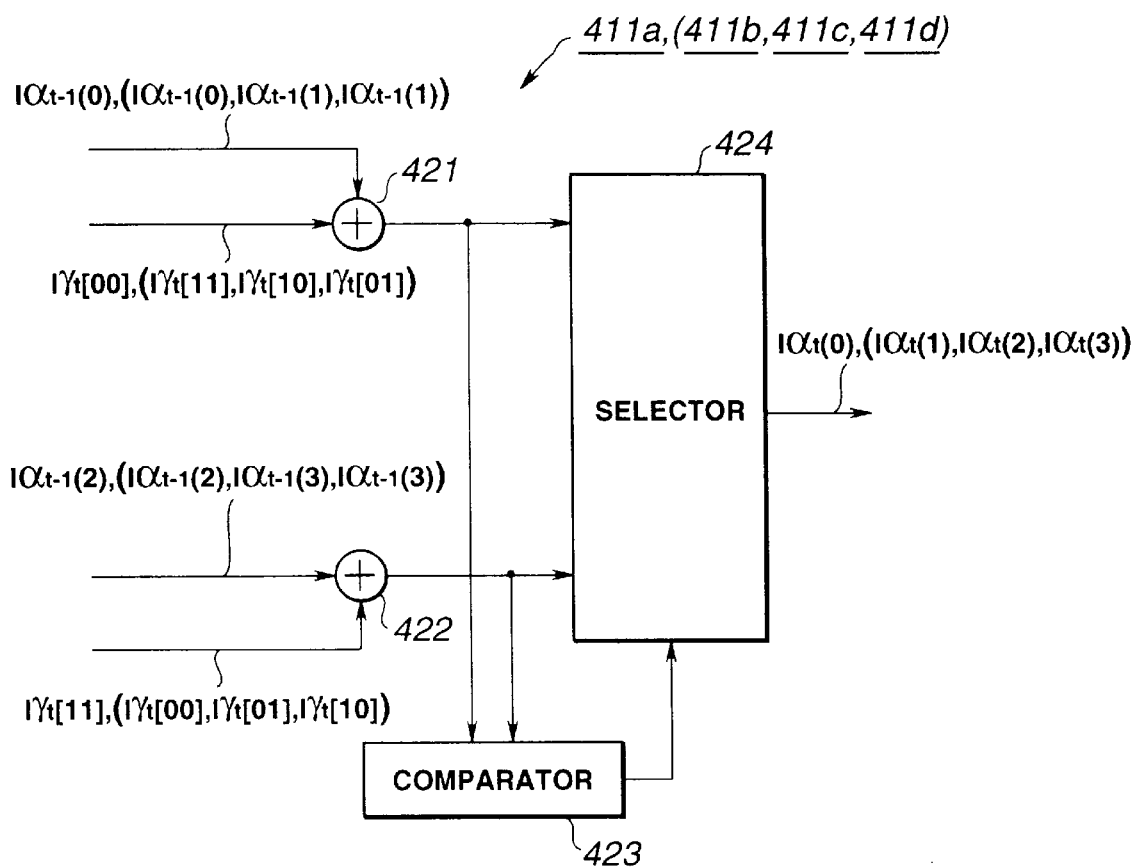
FIG. 12 is a block diagram showing the structure of an addition comparison selection circuit within the Iα computation circuit.

The addition comparison selection circuits 411a to 411d are configured in common as shown in FIG. 12. The addition comparison selection circuit 411a will now be explained subsequently. Iγ$_t$[00] (probability of a branch getting to the state 0, indicated by a broken line in FIG. 3) and Iα$_{t-1}$[0] (probability of a branch getting to the state 0 one time point ahead in FIG. 3) are summed together by an adder 421. Also, Iγt [11] (probability to the state 0 by a solid line in FIG. 5) and Iα$_{t-1}$(2) (probability to the state 2 one time point ahead in FIG. 5) are summed together by the adder 422. The results of addition by the adders 421, 422 are compared to each other in a comparator circuit 423 and the result of addition by the adder 421 or that by the adder 421, whichever is larger, is retrieved as the probability Iα$_t$(0). Although not explained specifically, the same operations are preformed for the addition comparison selection circuits 411b to 411d.

Reverting to FIG. 10, the Iα computation storage circuit 44 includes RAMs 406 and 407 for sequentially storing the probabilities Iα(0) to Iα(3), outputted by the register 405, in accordance with the control signal Scα to output the stored data in a pre-set sequence, a selection circuit 408 for selectively retrieving Iα outputted by these RAMs 406 and 407 in accordance with the control signal Scα to convert it into Iγ($\lambda$), and an output terminal 409 for outputting this Iα($\lambda$). If the number of bits of Iα is 8, the number of bits of the probabilities Iαt(0) to Iαt(3) is 32. These 32 bits are stored as one word in the RAMs 406, 407.

Figure 13:
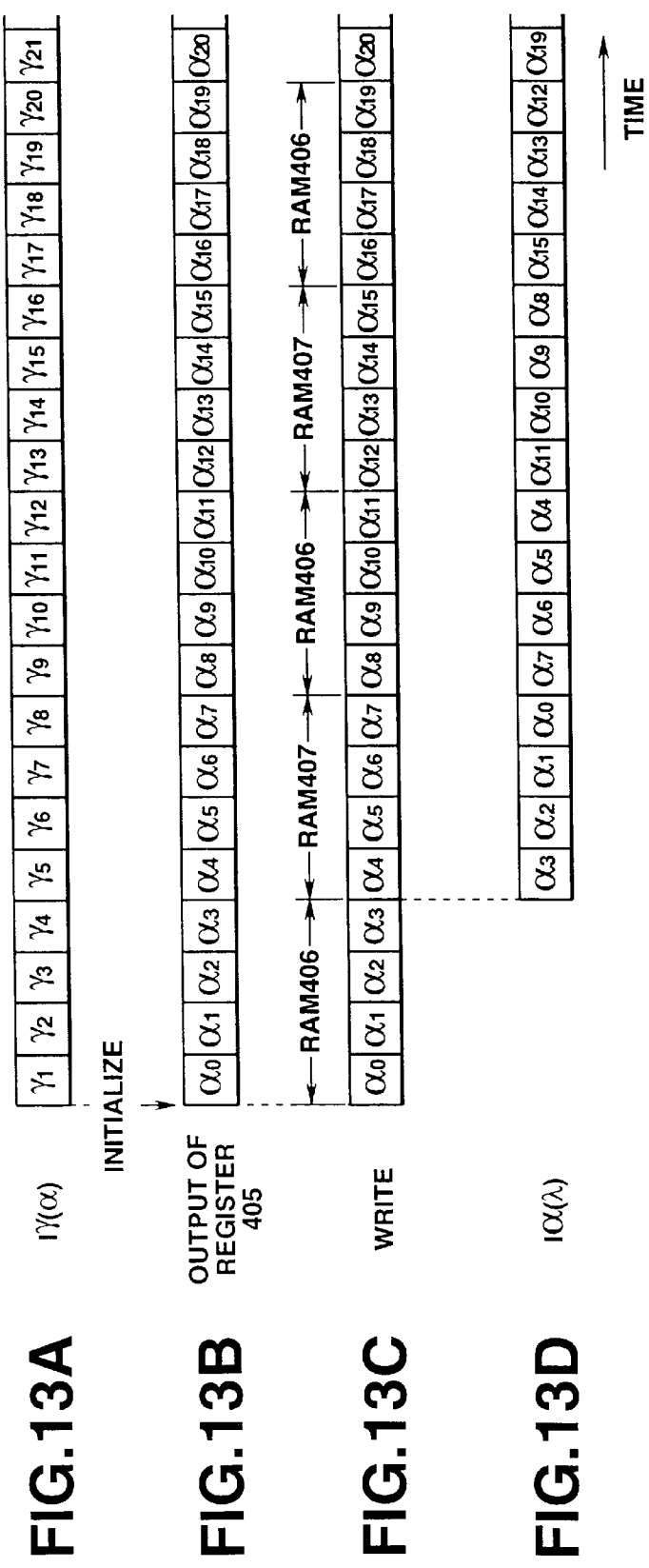
FIG. 13 is a timing chart for illustrating the operation of a register and a RAM making up the Iα computation storage circuit.

The Iα computation storage circuit 44 is initialized at a time point directly before the probability Iγ($\alpha$) is output by the Iγ computation storage circuit 43 (see FIG. 9B and FIG. 13A). By this initialization, an initial value Iα$_0$ is selected by the selector 404 and the initial value thus selected (Iα$_0$[00] to Iα$_0$[11]) is set in the register 405 (FIG. 13B). As from the next following clock period, the Iγ computation storage circuit 403 sequentially computes Iαt of the next time point (FIG. 13B) by the Iα computing circuit 403, from the probability Iγ($\alpha$) sent from the Iγ computation storage circuit 43 and the probability Iα$_{t-1}$ outputted by the register 405 to store this Iα$_t$ again in the register 405. In FIG. 13, the probabilities Iα(0) to Iα(3) associated with the time points t=1, 2, 3, . . . are indicated by $\alpha_1$, $\alpha_2$, $\alpha_3$, . . . respectively.

FIGS. 13C and 13D indicate the management of RAMs 406 and 407. These two RAMs 406 and 407 operate in a bank configuration having a storage capacity of 32 bits×4 words in order to store output data of the register 405, that is the probabilities Iα(0) to Iα(3), for a length corresponding to the truncated length, in order to store the probabilities Iα(0) to Iα(3) sequentially cyclically (FIG. 13C).

The operation of reading the probabilities Iα(0) to Iα(3) for the truncated length D, since the time these probabilities are written in the RAM 406, in a reversed order from the writing order, and the operation of reading the probabilities Iα(0) to Iα(3) for the truncated length D, since the time these probabilities are written in the RAM 407, in a reversed order from the writing order, are performed alternately. From the selection circuit 408, the probabilities Iα(0) to Iα(3), thus read out, are retrieved as the probability Iα($\lambda$) to be supplied to the soft output computation circuit 46 (FIG. 13D).

Figure 14:
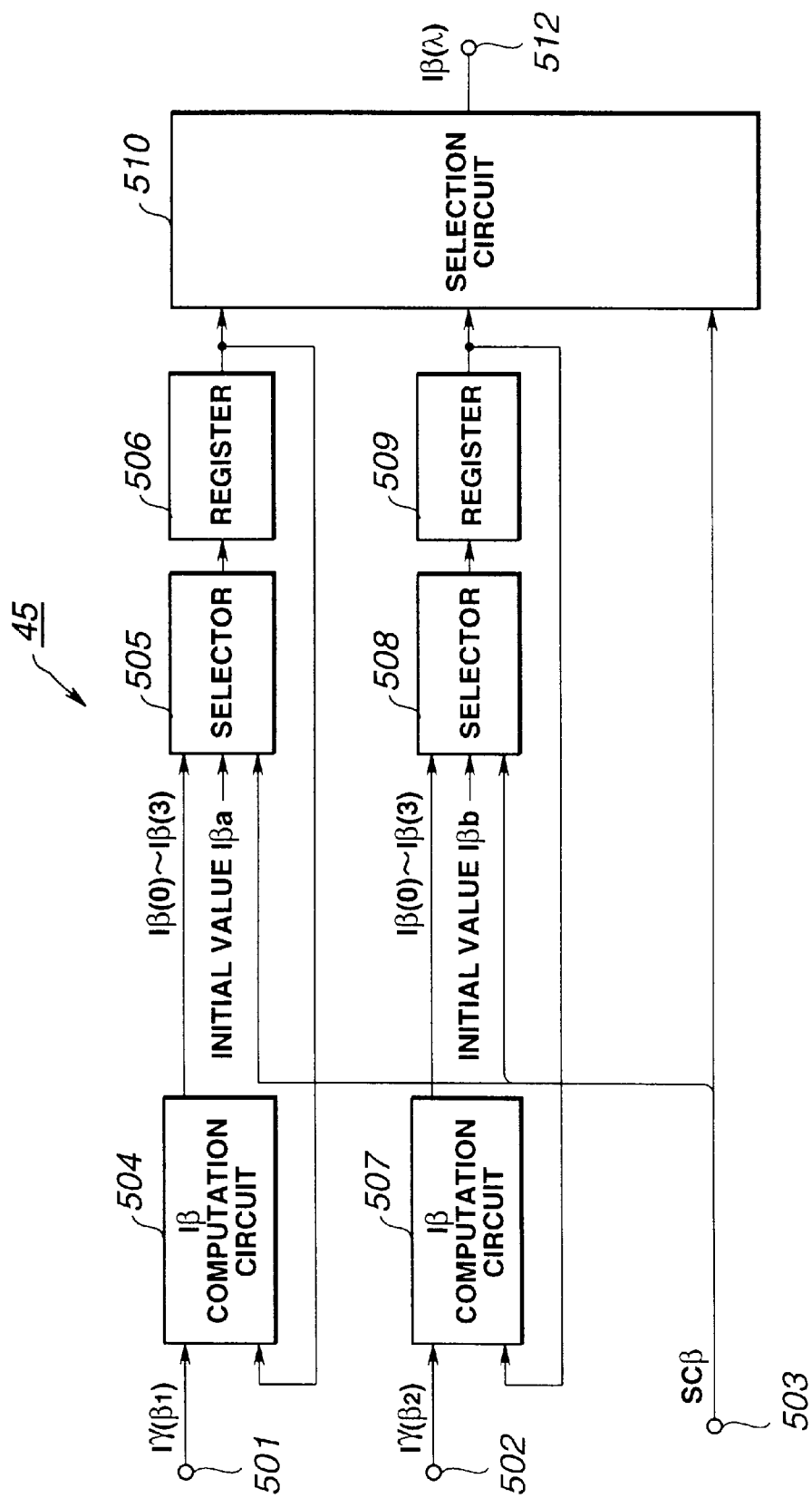
FIG. 14 is a block diagram showing the structure of the Iβ computation storage circuit.

FIG. 14 shows the configuration of the Iβ computation storage circuit 45. This Iβ computation storage circuit 45 includes: input terminals 501, 502 and 503, fed with the probabilities Iγ($\beta_1$) and Iγ($\beta_2$) and the control signal Scβ, respectively; an Iβ computation circuit 504 for computing Iβ in accordance with the equation (17) using Iγ($\beta_1$) supplied to the input terminal 501 and the probability Iβ set in the register 506; and a selector 505 for selecting one of Iβ outputted by the Iβ computation circuit 504 or the initial value Iβa to set the selected value in the register 506.

The selector 505 selects the initial value Iβa only at the initializing time point, based on the control signal Scβ, while selecting output data of the Iβ computation circuit 504 at other time points. The initialization occurs at time directly before the probability Iγ($\beta_1$) is output by the Iγ computation storage circuit 43 and subsequently at an interval of 2D, D being a truncated length. Herein, log ¼ is set as the initial value Iβa, which is usually the same value for all states (e.g., 0 or log 1/M). However, when decoding the terminated code, log 1 (=0) and log 0 (==$\infty$) are accorded as the values for the terminating state and other states, respectively.

Figure 15:
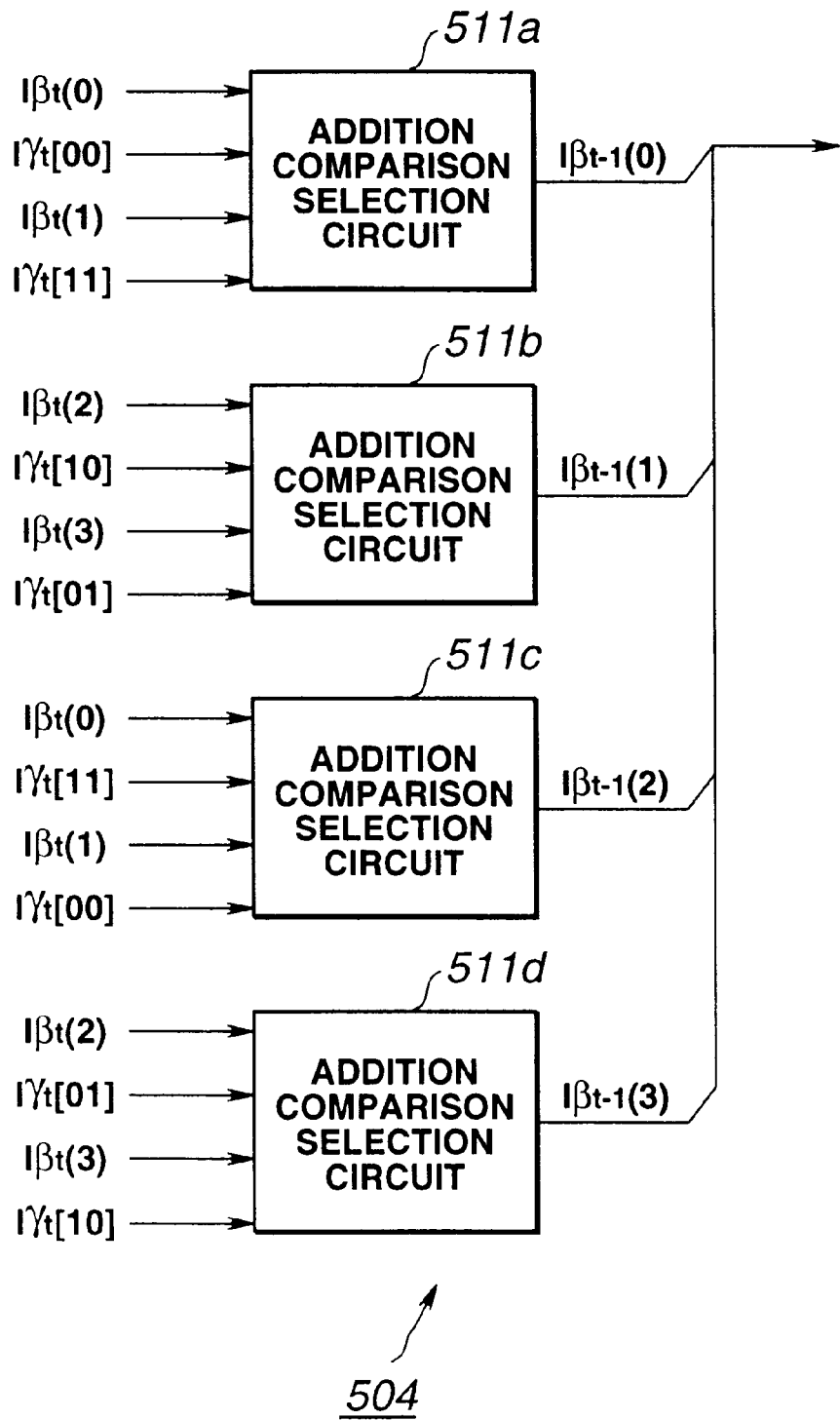
FIG. 15 is a block diagram showing the structure of an Iβ computing circuit in the Iβ computation storage circuit.

FIG. 15 shows the configuration of the Iβ computation circuit 504 made up of four addition comparison selection circuits 511a to 511d. $I\gamma_t[00]$ to $I\gamma_t[11]$ and $I\beta_t(0)$ to $I\beta_t(3)$ are distributed to the addition comparison selection circuits 511a to 511d based on transitions on the trellis. The addition comparison selection circuits 511a to 511d select a larger one of two results of addition of Iβ and Iγ to find Iβ in each state for the previous time point.

The addition comparison selection circuit 511a is fed with $I\gamma_t[00]$, $I\gamma_t[11]$ and with $I\beta_t(0)$, $I\beta_t(1)$ to compute the probability $I\beta_{t-1}(0)$ for the state 0. The addition comparison selection circuit 511b is fed with $I\gamma_{t-1}[10]$, $I\gamma_t[01]$ and with $I\beta_t(2)$, $I\beta_t(3)$ to compute the probability $I\beta_{t-1}(1)$ for the state 1.

The addition comparison selection circuit 511c is fed with $I\gamma_t[11]$, $I\gamma_t[00]$ and with $I\beta_t(0)$, $I\beta_t(1)$ to compute the probability $I\beta_{t-1}(2)$ for the state 2. The addition comparison selection circuit 511d is fed with $I\gamma_t[01]$, $I\gamma_t[10]$ and with $I\beta_t(2)$, $I\beta_t(3)$ to compute the probability $I\beta_{t-1}(3)$ for the state 3.

Figure 16:
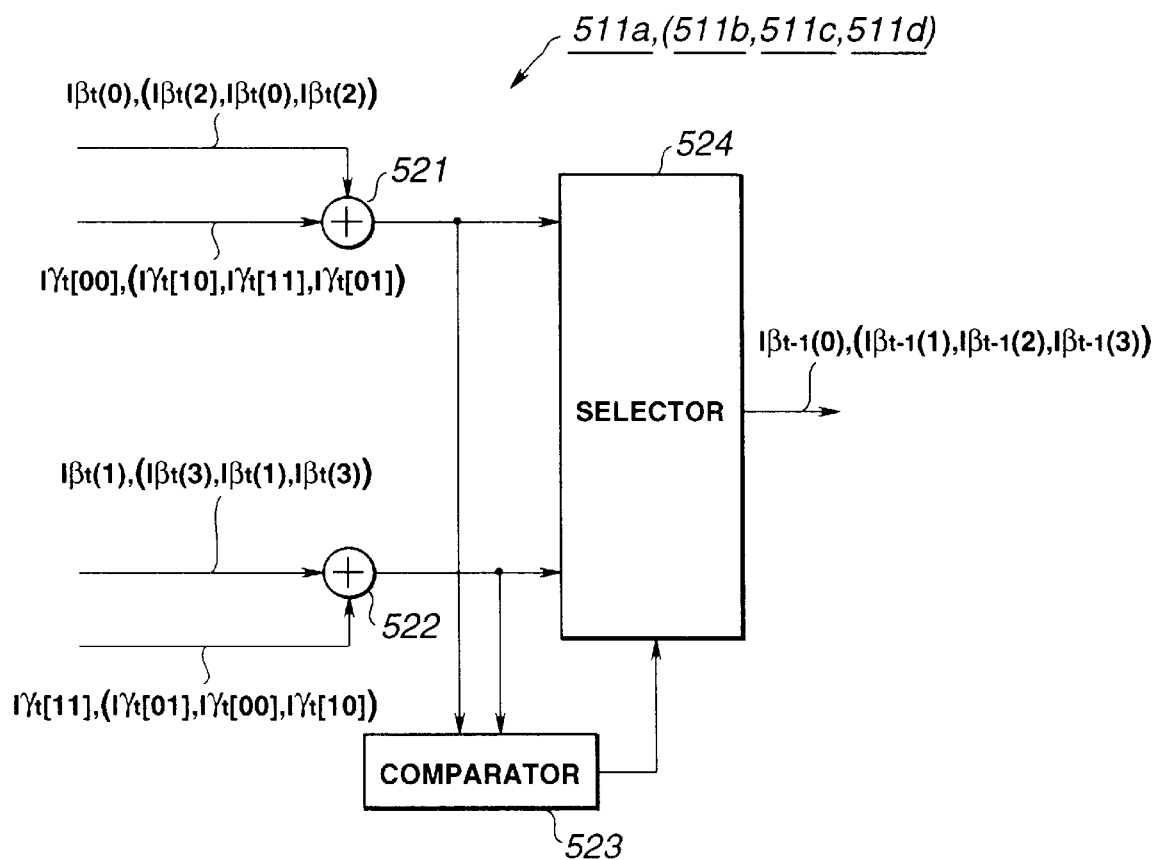
FIG. 16 is a block diagram for illustrating the structure of an addition comparison selection circuit in the Iβ computation circuit.

The addition comparison selection circuits 511a to 511d are configured in common as shown in FIG. 16. The following description is made of the addition comparison selection circuit 511a. $I\gamma_1[00]$ (the probability of a branch getting to the state 0, indicated by a broken line in FIG. 5) and $I\beta_t[0]$ (the probability of getting to the state 0 by retrograding down the time axis as from the terminal point of the truncated length in FIG. 5) are summed together by an adder 521. Also, $I\gamma_t[11]$ (the probability of a branch getting to the state 0, indicated by a solid line in FIG. 5) and $I\beta_t[1]$ (the probability of getting to the state 1 by retrograding down the time axis as from the terminal point of the truncated length in FIG. 5) are summed together by an adder 522. The results of addition by the adders 521 and 522 are compared to each other in a comparator circuit 523 and the result of addition by the adder 521 or that by the adder 522, whichever is larger, is retrieved as the probability $I\beta_{t-1}(0)$. Although not explained specifically, the same operations are performed for the addition comparison selection circuits 511b to 511d.

Reverting to FIG. 14, the Iβ computation storage circuit 45 includes an Iβ computation circuit 507 for computing Iβ, in accordance with the equation (17), using the probability $I\gamma(\beta_2)$ sent to the input terminal 502 and the probability Iβ set in the register 509 and a selector 508 for selecting Iβ outputted by the Iβ computation circuit 507 or the initial value Iβb to set the selected value in the register 509.

The selector 508 selects the initial value Iβb only at the initializing time point, based on the control signal Scβ, while selecting output data of the Iβ computation circuit 507 at other time points. The initialization occurs at a time directly before the probability $I\gamma(\beta_2)$ is output by the Iγ computation storage circuit 43 and subsequently at an interval of 2D, D being a truncated length. The initial value Iβb is set similarly to Iβa. Although not explained specifically, the Iβ computation circuit 507 is configured similarly to the Iβ computation circuit 504 (FIGS. 15 and 16).

The Iβ computation storage circuit 45 includes a selection circuit 510 for selectively retrieving the probabilities Iβ(0) to Iβ(3), outputted by the registers 506 and 509, in accordance with the control signal Scβ, to convert it into Iβ(λ), and an output terminal 512 for outputting this Iβ(λ). If the number of bits of Iβ is 8, the number of bits of the probabilities $I\beta_{t-1}(0)$ to $I\beta_{t-1}(3)$ outputted by the Iβ computation circuits 504 and 507 is 32.

The Iβ computation storage circuit 45, shown in FIG. 14, initializes the register 506 at a time just before the probability $I\gamma(\beta_1)$ is output by the Iγ computation storage circuit 43 (FIGS. 9C and 17A) and subsequently at an interval of 2D. In this initialization, the selector 505 selects the initial value Iβa, which is set in the register 506. From the next clock period on, the Iβ computation circuit 504 sequentially computes $I\beta_{t-1}$ of the previous time point, from the probability $I\gamma(\beta_1)$ supplied by the Iγ computation storage circuit 43 and $I\beta_t$ outputted by the register 506, this $I\beta_{t-1}$ being again stored in the register 506 and outputted at the next clock time (FIG. 17C). Meanwhile, FIG. 17 shows the probabilities Iβ(0) to Iβ(3), associated with the time points t=1, 2, 3, . . . , with $62_1$, $\beta_2$, $\beta_3$, . . . , respectively.

The register 509 is initialized at a time just before the probability $I\gamma(\beta 2)$ is output by the Iγ computation storage circuit 43 (FIGS. 9D and 17B) and subsequently at an interval of 2D. In this initialization, the selector 508 selects the initial value Iβb, which is set in the register 506. From the next clock period on, the Iβ computation circuit 507 sequentially computes $I\beta_{t-1}$ of the previous time point, from the probability $I\gamma(\beta_2)$ supplied by the Iγ computation storage circuit 43 and $I\beta_t$ outputted by the register 509, this $I\beta_{t-1}$ being again stored in the register 509 and outputted at the next clock time (FIG. 17D). The selection circuit 510 selectively retrieves outputs of the registers 506 and 509 to derive the probability Iβ(γ) to be supplied to the soft output computation circuit 46, as shown in FIG. 17E.

Figure 18:
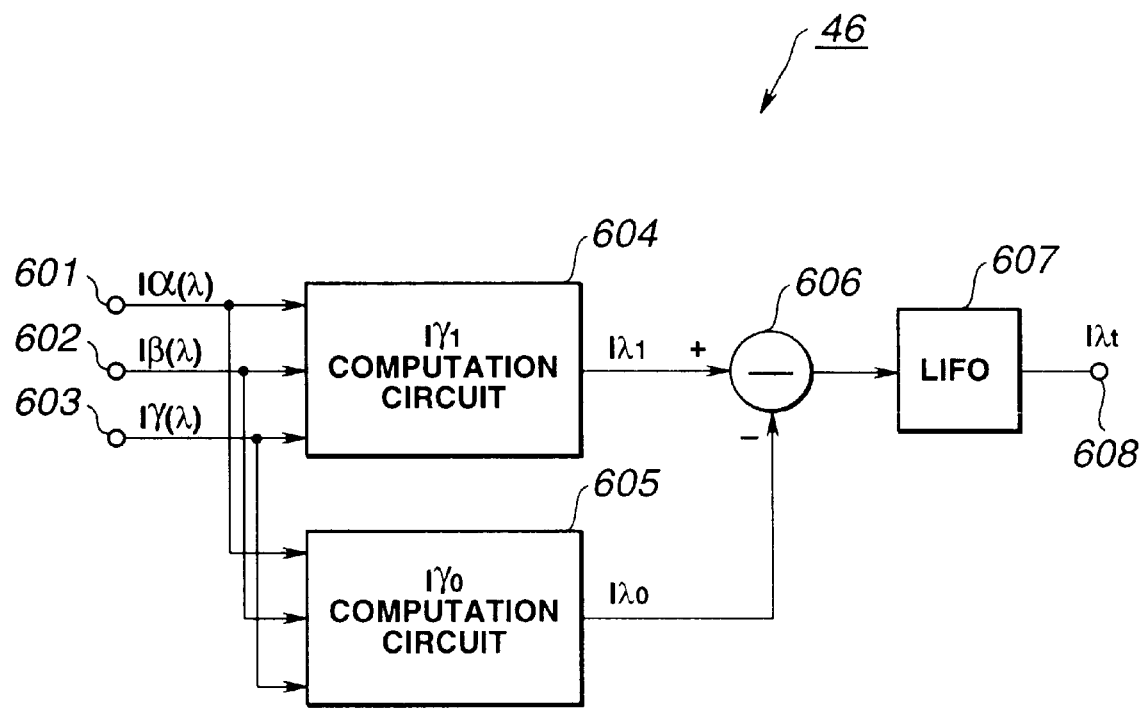
FIG. 18 is a block diagram showing the structure of a soft output computation circuit in the decoder.

FIG. 18 shows the configuration of the soft output computation circuit 46, which is made up of: input terminal 601, 602 and 603 and to which the probabilities Iα(λ), Iβ(λ) and Iγ(λ), respectively, an $I\lambda_1$ computing circuit 604 and an $I\lambda_0$ computing circuit 605 for computing the first and second terms of the right side of the equation (19); a subtractor 606 for subtracting the output $I\lambda_0$ of the computing circuit 605 from the output $I\lambda_1$ of the computing circuit 604 to obtain $I\lambda_t$ of the equation (19); a last-in first-out (LIFO) memory 607 for chronologically re-arraying $I\lambda_t$ outputted by the subtractor 606 to output the re-arrayed data; and an output terminal 608 for outputting the soft output $I\gamma_t$.

Figure 19:
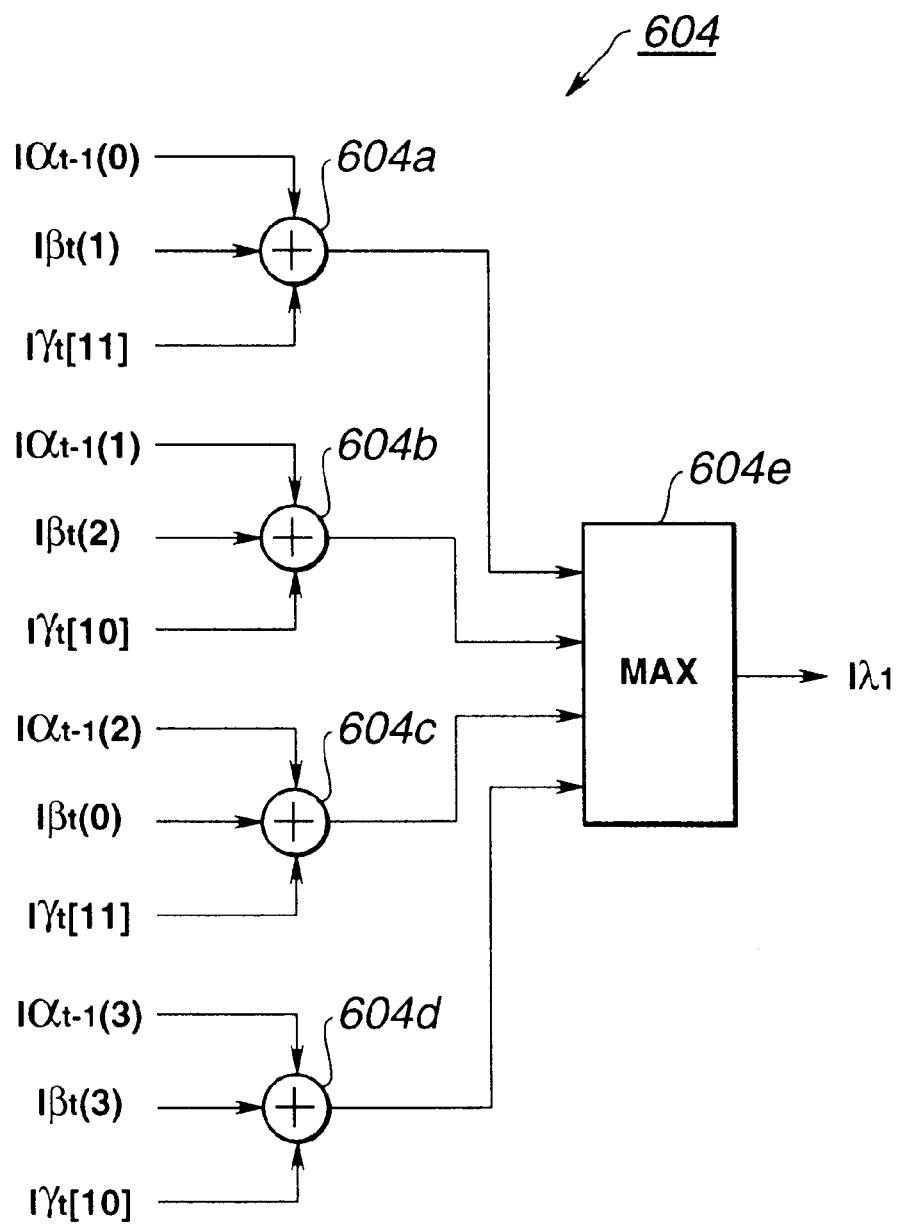
FIG. 19 is a block diagram showing the structure of an Iλ$_1$ computation circuit in the soft output computation circuit.

FIG. 19 shows the configuration of the $I\lambda_1$ computing circuit 604. This $I\lambda_1$ computing circuit 604 includes four adders 604a to 604d and a maximum value selection circuit 604e. Signals are distributed to adders 604a to 604d in the following fashion, based on the status transitions on the trellis. That is: $I\alpha_{t-1}(0)$, $I\beta_1(1)$ and $I\gamma_1[11]$ are supplied to adder 604a;, $I\beta_t(2)$ and $I\gamma_1[10]$ are supplied to adder 604b; $I\alpha_{t-1}(2)$, $I\beta_t(0)$ and $I\gamma_t[11]$ are supplied to adder 604c; and $I\alpha_{t-1}(3)$; $I\beta_t(3)$; $I\gamma_t[10]$ are supplied to adder 604d.

The maximum value of the results of addition by the adders 604a to 604d is selected by the maximum value selection circuit 604e and outputted as $I\lambda_1$.

Figure 20:
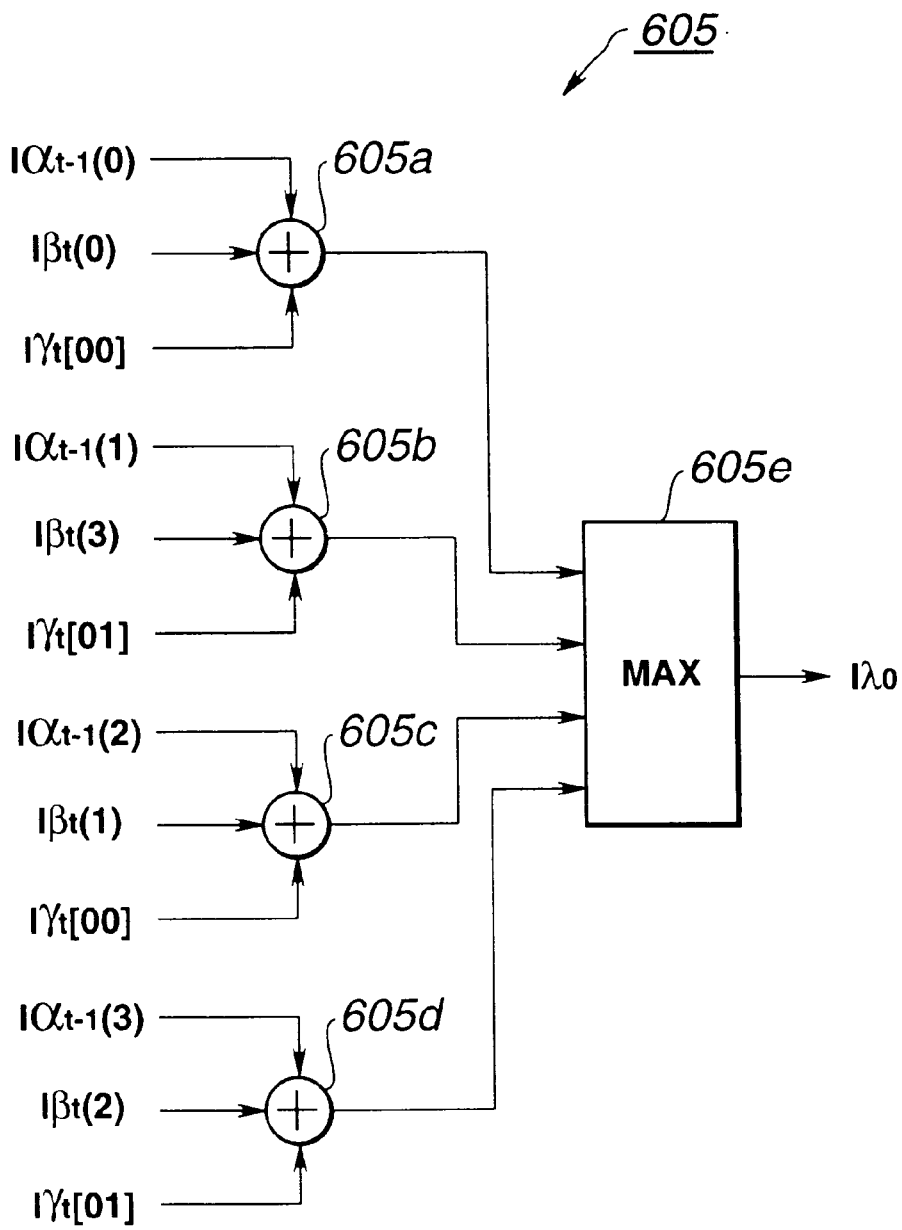
FIG. 20 is a block diagram showing the structure of an Iλ$_0$ computation circuit in the soft output computation circuit.
Figure 22A:
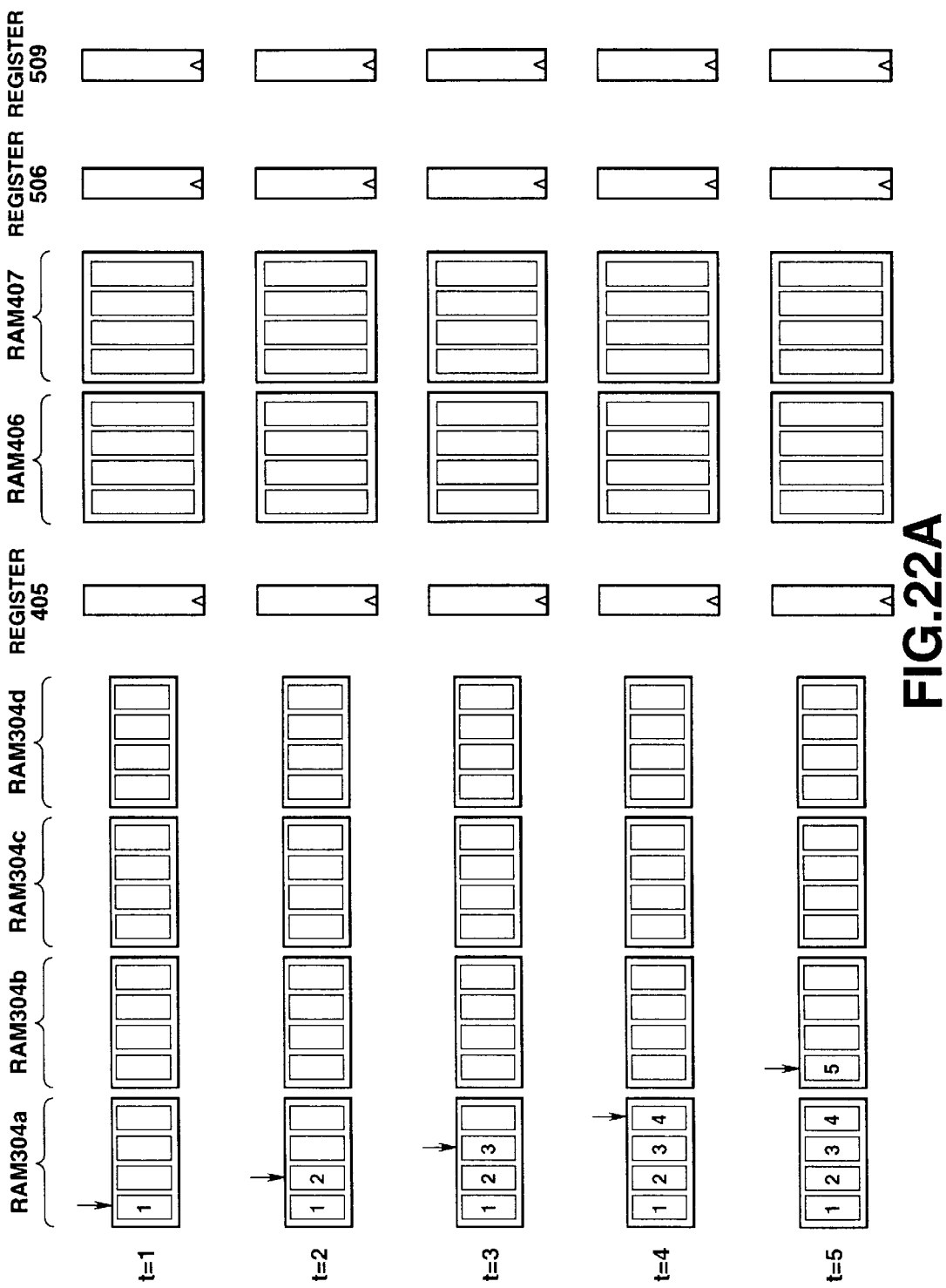
FIGS. 22A to D illustrate the contents of a memory management in the Iγ computation circuit.
Figure 22B:
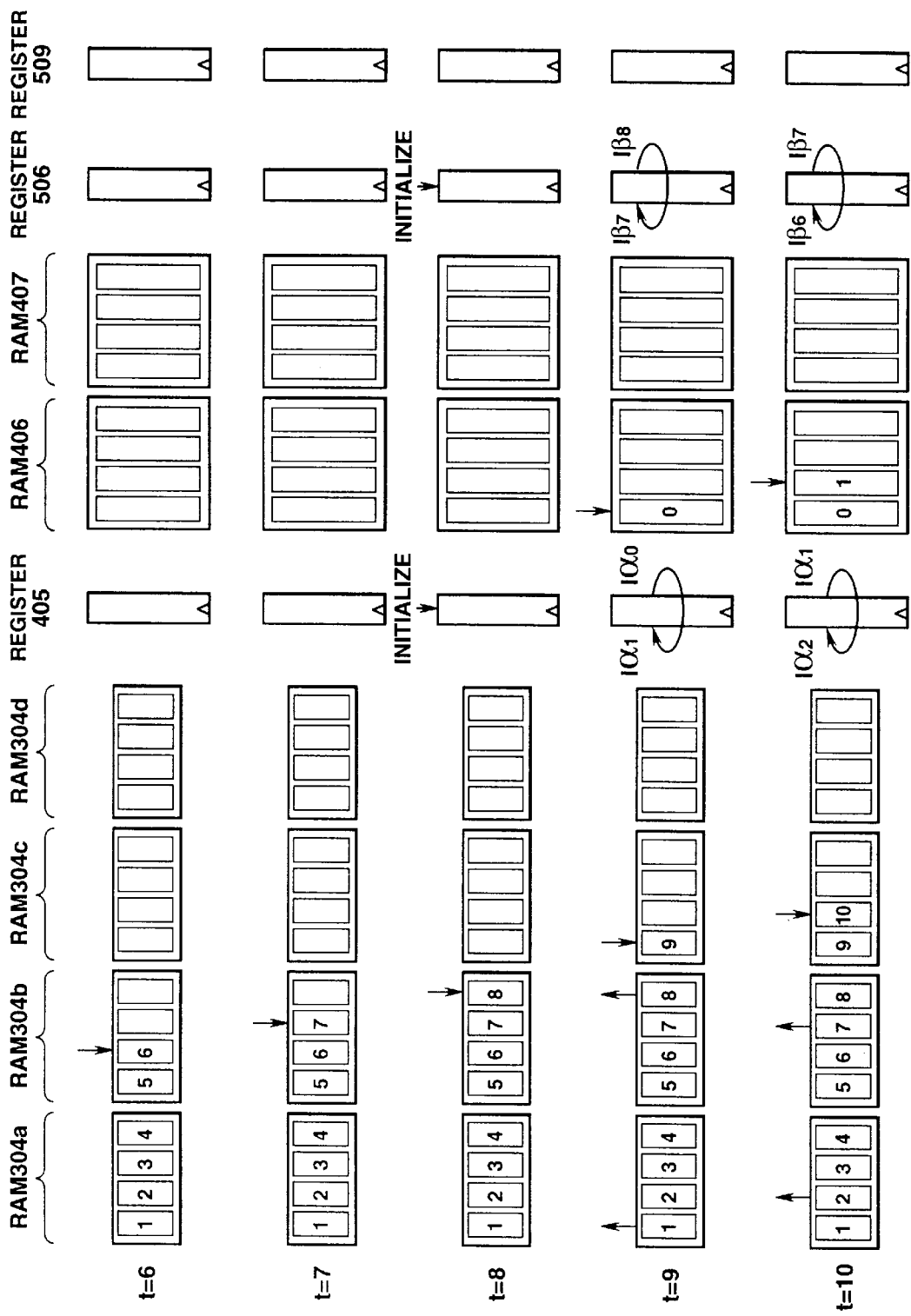
Figure 22C:
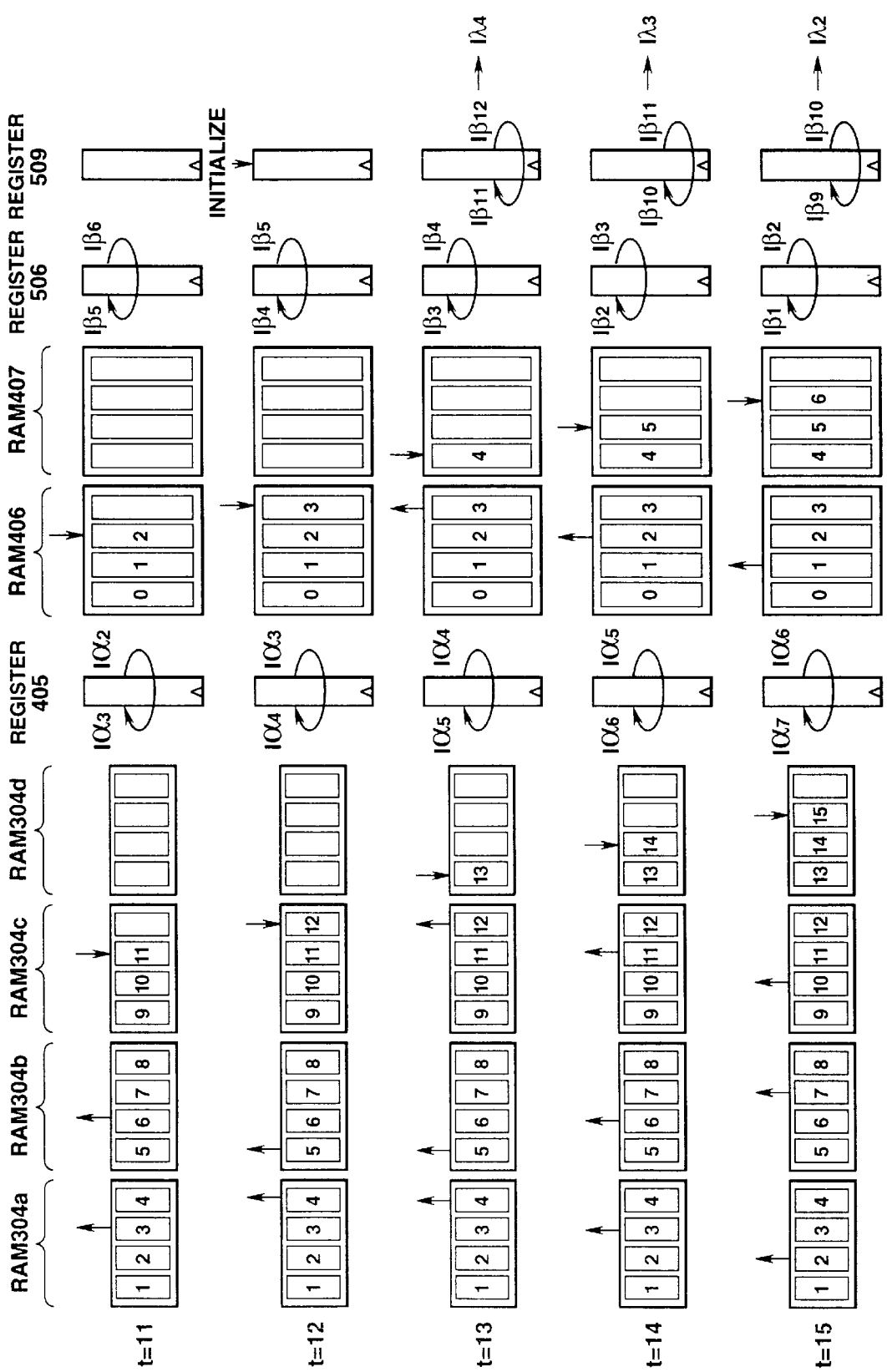
Figure 22D:
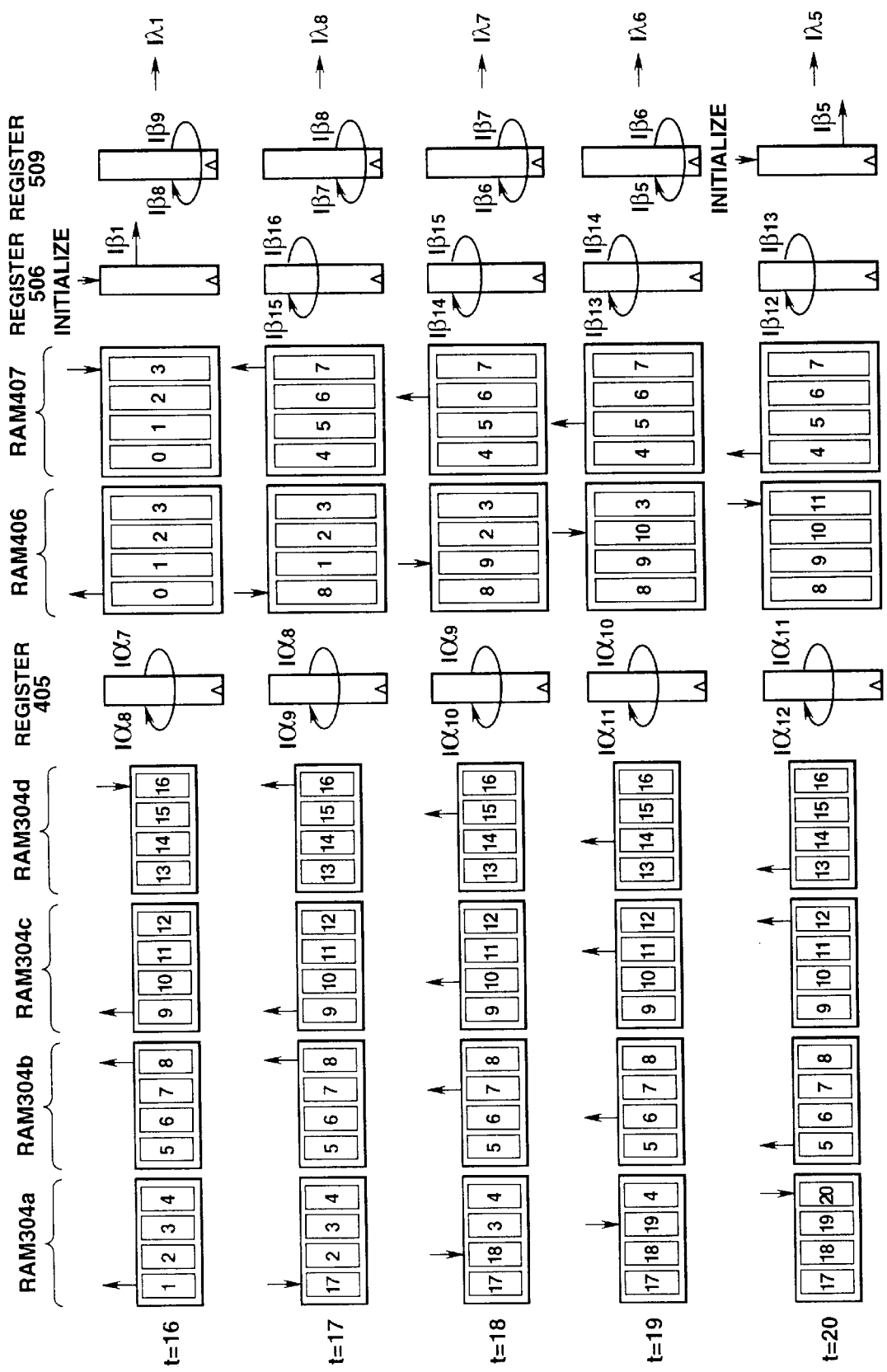

FIG. 20 similarly shows the configuration of the $I\lambda_0$ computing circuit 605. This $I\lambda_2$ computing circuit 605 includes four adders 605a to 605d and a maximum value selection circuit 605e. Signals are distributed to adders 605a to 605d in the following fashion, based on the status transitions on the trellis. That is: $I\alpha_{t-1}(0)$, $I\beta_1(0)$ and $I\gamma_t[00]$ are supplied to the adder 605a; $I\alpha_{1-1}(1)$, $I\beta_{t-1}(3)$ and $I\gamma_t[01]$ are supplied to adder 604b $I\alpha_{t-1}(2)$, $I\beta_1(1)$ and $I\gamma_t[00]$ are supplied to the adder 605c; and $I\alpha_{t-1}(3)$, $I\beta_t(2)$ and $I\gamma_t[01]$ are supplied to the adder 605d. The maximum value of the results of addition by the adders 605a to 605d is selected by the maximum value selection circuit 605e and outputted as $I\lambda_0$.

Probabilities Iα(λ), Iβ(λ) and Iγ(λ) are input to input terminals 601, 602 and 603, respectively, of soft output computation circuit 46 (FIGS. 21A, B and C). At each clock period, the $I\lambda_1$ computing circuit 604 computes the first term of the right side of the equation (19) to obtain $I\lambda_1$, while the $I\lambda_0$ computing circuit 605 computes the second term of the right side of the equation (19) to obtain $I\lambda_1$, so that the subtractor 606 outputs $I\lambda_t$ at each time point t (FIG. 21D). The subtractor 606 sequentially outputs $I_{\lambda_t}$, which is fed to the LIFO memory 607 and chronologically re-arrayed so as to be outputted as re-arrayed soft output $I\lambda_t$. In FIG. 21E, the soft output $I\lambda t$ associated with the time points t=1, 2, 3, . . . . is denoted as inputs $\lambda_1, \lambda_2, \lambda_3, \ldots$.

Referring to the drawings, the memory management by the controller 41 in the decoder 4 is explained in further detail. FIGS. 22A to 22D show the contents of the memory management by chronologically showing the following stored contents and outputs: RAMs 304a to 304d; register 405; RAMs 406 and 407; and registers 506 and 509. In the RAMs 304a to 304d and RAMs 406 and 407, arrows ↓ and ↑ indicate writing in a specified address and readout from a specified address, respectively.

In FIGS. 22A to 22D, the following operations (1) to (6) are simultaneously executed at, for example, t=13:

(1) $I\gamma_{13}$ is stored in the RAM 304d;
(2) $I\alpha_6$ then is found on the basis of $I\alpha_4$ outputted by the register 405 and $I\gamma_5$ outputted by the RAM 304b to store $I\alpha_5$ thus found again in the register 405;
(3) $I\alpha_4$ found at the previous time point to the outputting from the register 506 is stored in the RAM 407;
(4) $I\beta_3$ is found on the basis of $I\beta_4$ outputted by the register 506 and $I\gamma_4$ outputted by the RAM 304a to store $I\beta_4$ thus found again in the register 506;
(5) $I\beta_{11}$ is found on the basis of $I\beta_{12}$ outputted by the register 509 and $I\gamma_{12}$ outputted by the RAM 304c to find $I\beta_3$ which again is stored in the register 506; and
(6) $I\alpha_4$ is found on the basis of $I\beta_4$ outputted by the register 506, $I\gamma_4$ outputted by the RAM 304a and $I\alpha_3$ outputted by the RAM 406.

Figure 23:
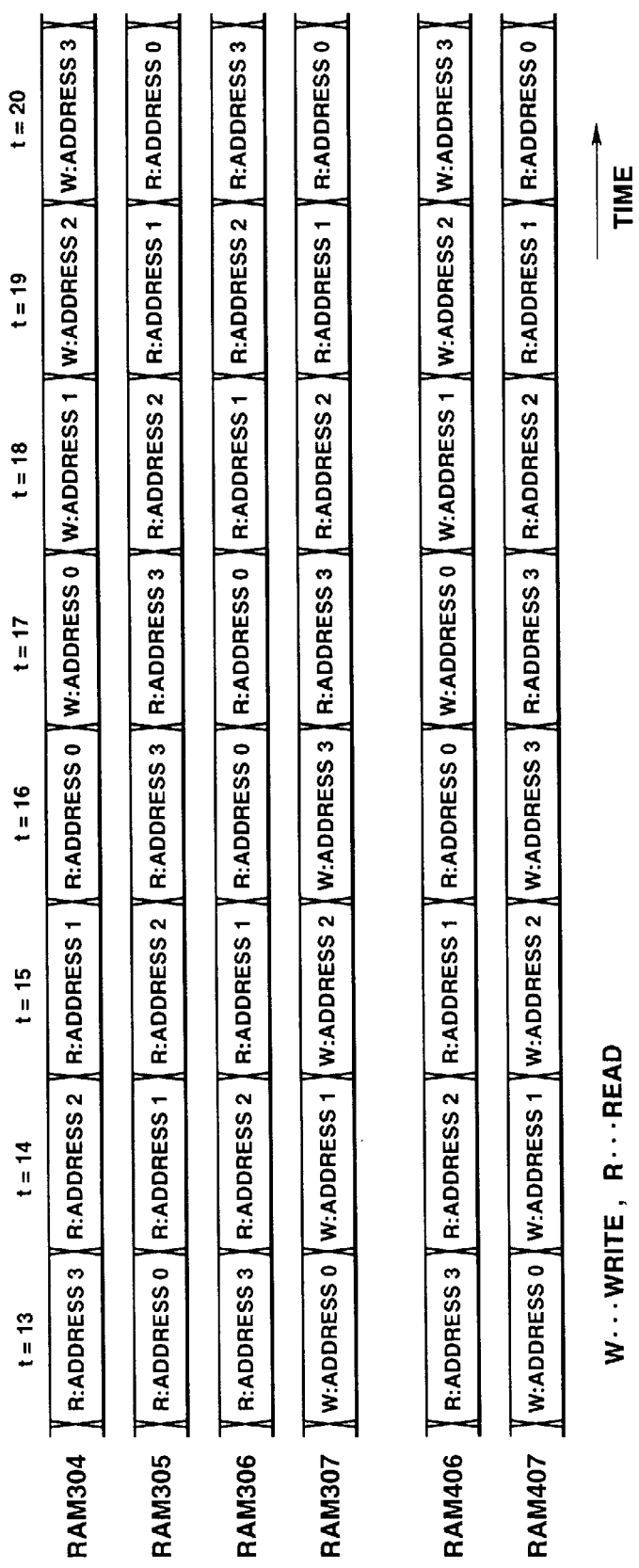
FIG. 23 is a timing chart of the memory management.

Similar operations are performed for other time points. By iteration of these operations, $\lambda_t$ can be found one at a time. However, since $\lambda_t$ is found in this method in the reverse order with respect to the intrinsic chronological order, the soft output $\lambda_t$ is first re-arrayed in the intrinsic chronological order, by exploiting the LIFO memory 607, as described above. The re-arrayed soft output is then outputted. FIG. 23 shows the timing chart for t=13 until t=20 of the memory management which is based on the above-described operations.

In the preferred embodiment, computation of $I\beta$ in the truncated length (computation by the $I\beta$ computation circuit 507 of FIG. 14) and the computation of $I\beta$ retrograding down the time axis by not less than the truncated length (computation by the $I\beta$ computation circuit 504 of FIG. 14) are carried out in parallel, so that the computation of $I\beta$ per clock is the number of states×2. Thus, the volume of computation can be reduced significantly in comparison with the conventional SW-Max-Log-BCJR algorithm. Moreover, it is sufficient to access each memory only once per clock. Therefore, in the preferred embodiment, the decoding operation of the convolutional codes can be executed speedily.

Meanwhile, since the memory management in the preferred embodiment is not performed in dependence upon the method for computation of $I\alpha$, $I\beta$ or $I\gamma$, it is possible to use a method other than the method of referring to the ROM table as the $I\gamma$ computing method.

The SW-Max-Log-BCJR algorithm may be mounted by assembling the correction shown by the equation (20) in the computing circuits shown in FIGS. 11, 15, 19 and 20. In the following description, a soft output $I\lambda t$ is to be found in accordance with the SW-Log-BCJR algorithm.

As an example, it is assumed that the correction shown in FIG. 20 is to be assembled into the circuit of FIG. 11.

Figure 24:
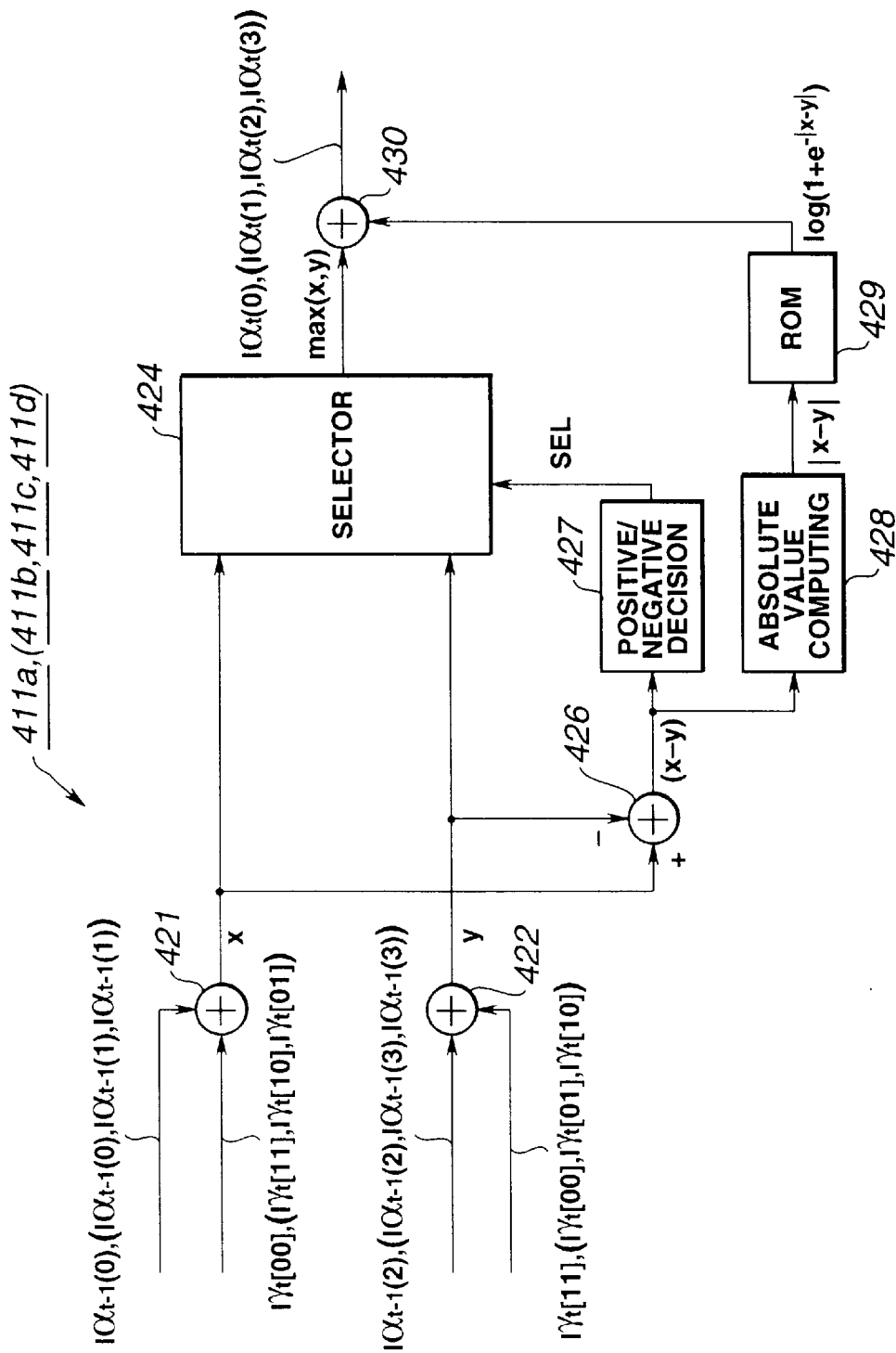
FIG. 24 is a block diagram showing the structure of an addition comparison selection circuit associated with the SW-Log-BCJR algorithm.

For assembling the correction shown by the equation (20), it is necessary to replace the structure shown in FIG. 12 by the structure shown in FIG. 24 in each of the addition comparison selection circuits 411a to 411d. In FIG. 24, the parts corresponding to those of FIG. 9 are depicted by the same reference numerals.

The addition comparison selection circuit 411a is now explained. $I\gamma_t[00]$ and $I\alpha_{t-1}(0)$ are summed in the adder 421, while $I\gamma_t[11]$ and $I\alpha_{t-1}(2)$ are summed in the adder 422. A subtractor 426 effects subtraction of the result of addition of x of the adder 421 and the result of addition y of the adder 422 and the result of subtraction (x−y) is sent to a positive/negative decision circuit 427, from which signals "1" and "0" are outputted if the result of subtraction (x−y) is not less than 0 and less than 0, respectively.

An output signal of the positive/negative decision circuit 427 is sent to the selector 424 as a selection signal SEL. From the selector 424, the result of addition x of the adder 421 or the result of addition y of the adder 422 is retrieved depending on whether the selection signal SEL is "1" or "0", respectively. Consequently the result of addition x or y of the adder 421 or 422, whichever is larger, is selectively taken out to execute the computation corresponding to the first term of the right side of the equation (20).

The result of subtraction (x−y) of the subtractor 426 is sent to an absolute value computing circuit 428 to compute an absolute value $|x-y|$. This absolute value $|x-y|$ is sent as a readout address signal to a ROM 429 constituting the table. From this ROM 429, $\log(1+e^{-|x-y|})$, as the second term of the right side is obtained in the equation (20). An adder 430 sums an output signal max(x−y) of the selector 424 to an output signal $\log(1+e^{-|x-y|})$ of the ROM 429 to output the result of addition as a probability $I\alpha_t(0)$, which is based on the SW-Log-BCJR algorithm. The above holds for the addition comparison selection circuits 411b to 411d, although these circuits are not explained specifically.

The foregoing description has been made assembling of the correction shown in the equation (20) into the circuit of FIG. 11. The correction indicated in the equation (20) can be made similarly for the circuits shown in FIGS. 15, 19 and 20 to enable the mounting of the SW-Log-BCJR algorithm.

In the above-described embodiment, the constraint length=3 and the truncated length=4. However, the constraint length and the truncated length may be of any suitable value without being limited to the above values. On the other hand, the RAM configuration may be varied such as by replacing the RAMs 304a to 304d by two dual port RAMs or by replacing the RAMs 406, 407 by a sole dual port RAM, or by employing a multi-port RAM in place of a single-port RAM, even though the memory read/write contents remain unchanged.

The memory management may be varied, such as by storing $I\beta$ instead of $I\alpha$ in a RAM. Although the SW-Max-BCJR algorithm and the SW-Log-BCJR algorithm are used in the above embodiment, any other suited soft output decoding algorithm may be used by way of further modifications.

In the above-described respectively embodiments, the probabilities $I\gamma[00]$ to $I\gamma[11]$ are read out with a delay corresponding to the truncated length D times 2, or 2D, from the RAMs 304a to 304d to decode the soft output. However, the delaying time for the probability information not less than the truncated length D suffices, without being limited to the truncated length D times 2, or 2D.

For example, it is also possible to extend a RAM 308 to the Iγ computation storage circuit 43 shown in FIG. 8 to delay the probability information for a time duration corresponding to the truncated length D times 3, or 3D.

Figure 25:
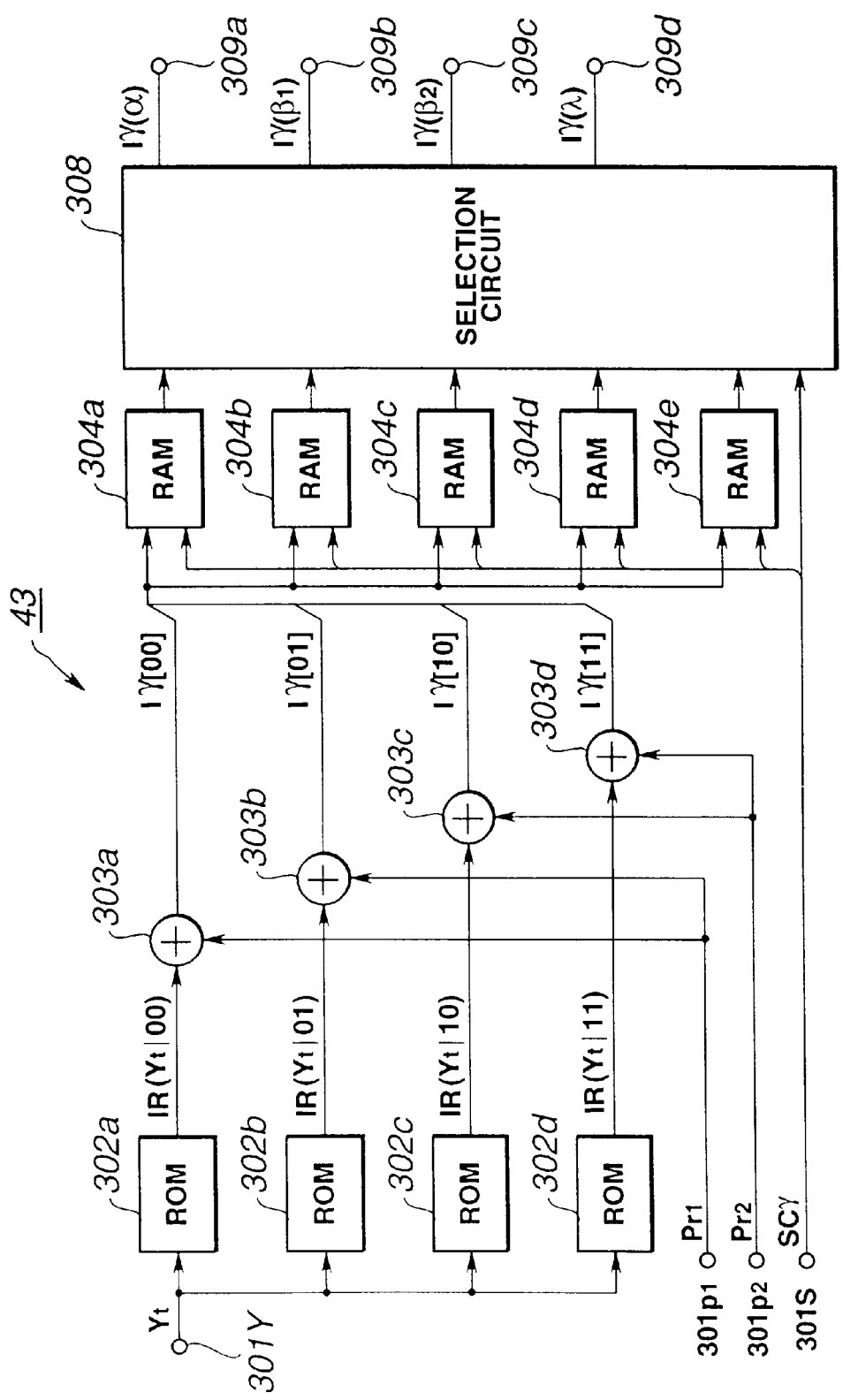
FIG. 25 is a block diagram showing an alternative structure of the Iγ computation storage circuit in the decoder.
Figure 26:
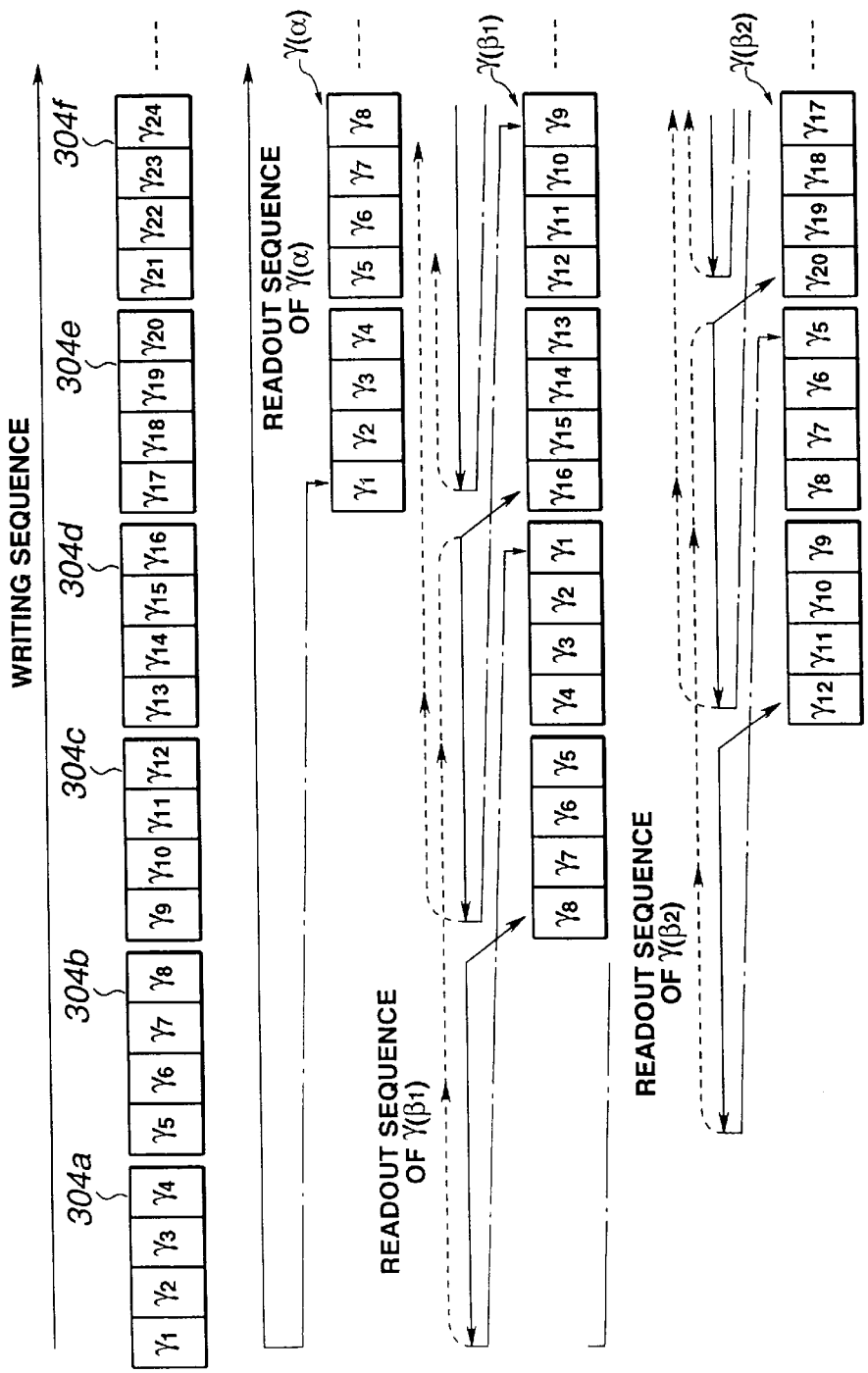
FIG. 26 is a timing chart for illustrating the operation of the Iγ computation storage circuit.

The Iγ computation storage circuit 43, configured as shown in FIG. 25, sequentially stores the probabilities Iγ[00], Iγ[01], Iγ[10] and Iγ[11] of the respective branches, associated with outputs [00], [01], [10] and [11] on the trellis obtained by the adders 303a to 303, in the RAMs 304a to 304e (FIG. 26A), to output probabilities Iγ[00] to Iγ[11] held with delay for a period corresponding to the truncated length D times 3, or 3D. The selection circuit 308 thus outputs the data Iγ[00] to Iγ[11] after delay as the probabilities Iγ(α) for the Iγ computation storage circuit 43 (FIGS. 26B, C).

The RAMs 304a to 304e and the selection circuit 308 partition the probabilities Iγ[00] to Iγ[11] every truncated length D and set a reference time point at a time point which has elapsed the truncated length D along the time axis in the direction from the terminal point of each truncated length D. If the probabilities Iγ[00] to Iγ[11] are stored in a volume corresponding to truncated length D times 2 up to these reference time points, the RAMs 304a to 304e and the selection circuit 308 output these probabilities Iγ[00] to Iγ[11] in a reverse order from the input sequence. Thus, the RAMs 304a to 304e and the selection circuit 308 output the probabilities Iγ[00] to Iγ[11] as the first probability Iγ(β_1) for the Iβ computation storage circuit 45 (FIGS. 26D, E), while outputting the probabilities Iγ[00] to Iγ[11], constituted by the probability Iγ delayed by the truncated length D from the first probability Iγ(β_1) in a similar sequence as the second probability Iγ(β2) for the Iβ computation storage circuit 45 (FIGS. 26F and G).

For the probability Iγ(λ) for the soft output computation circuit 46, the RAMs 304a to 304e and the selection circuit 308 output the probabilities Iγ[00] to Iγ[11], delayed a pre-set time in a sequence for the Iα computation storage circuit 44. Thus, the Iγ computation storage circuit 43 outputs the first probability Iγ in a sequence associated with the processing in the Iα computation storage circuit 44, Iβ computation storage circuit 45 and in the soft output computation circuit 46.

Figure 27:
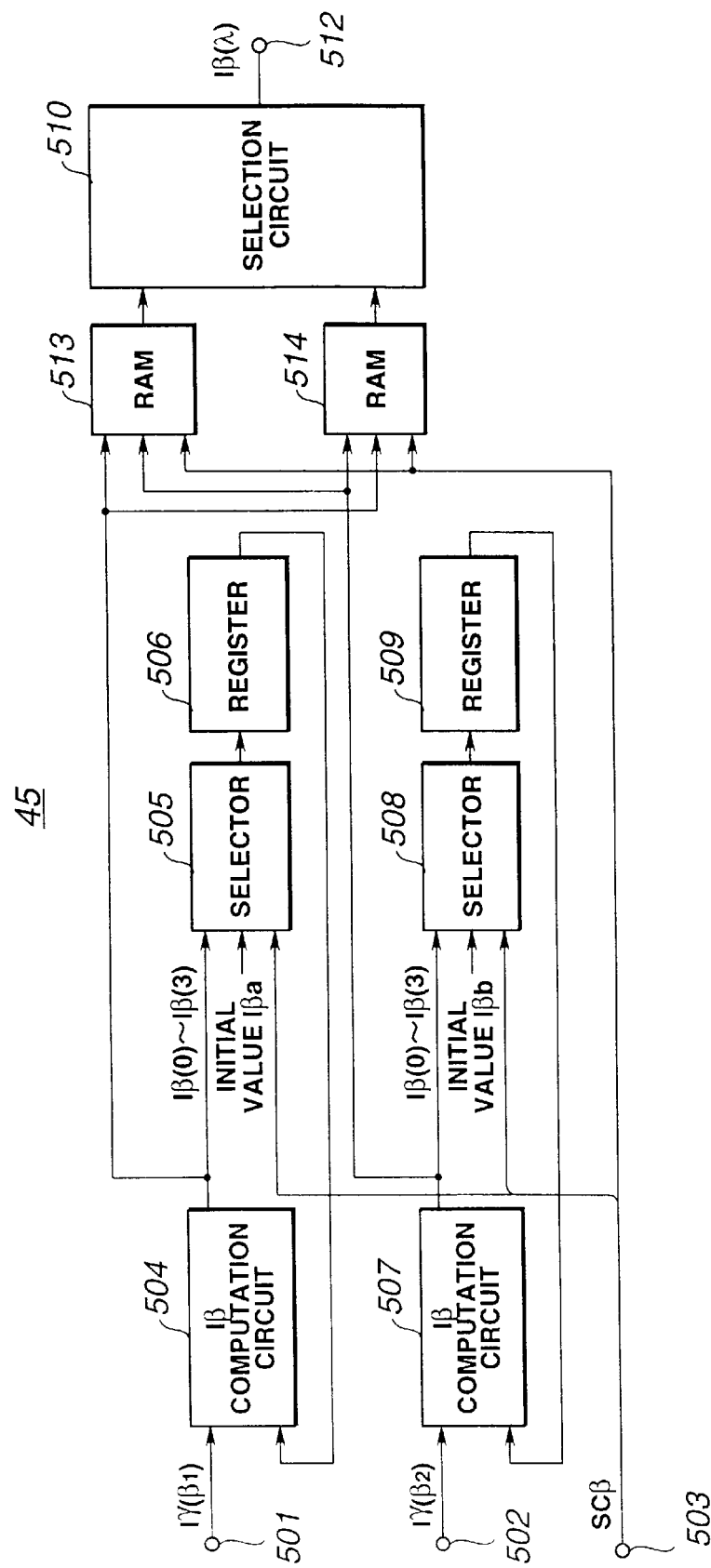
FIG. 27 is a block diagram showing an alternative structure of an Iβ computation storage circuit in the decoder.
Figures 28A, 28B, 28C, 28D, 28E:
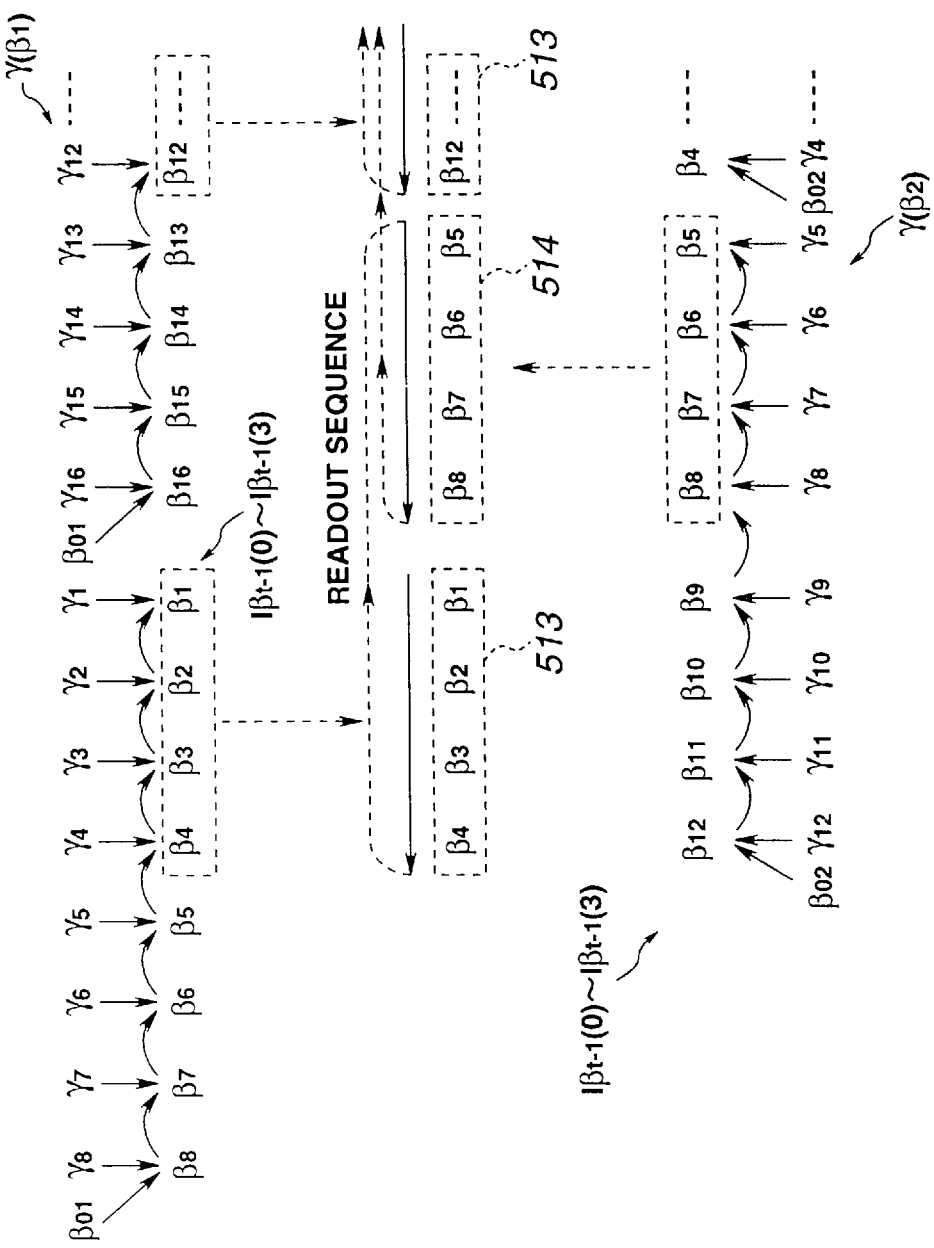
FIG. 28 is a timing chart for illustrating the operation of the Iβ computation storage circuit.

Referring to FIG. 27, the Iβ computation storage circuit 45 sends the probabilities $\beta_{t-1}(0)$ to $\beta_{t-1}(3)$, computed by the Iβ computation circuits 504 and 507, to the selection circuit 510 via RAMs 513 and 514.

In the Iβ computation storage circuit 45, shown in FIG. 27, the Iβ computation circuits 504 and 507 compute, from the first probability Iγ(β_1) and the second probability Iγ(β_2) outputted by the Iγ computation storage circuit 43, the probabilities $\beta_{t-1}(0)$ to $\beta_{t-1}(3)$, retrograding to each state of the received value $\beta_t$, based on the probabilities $\beta_{t-1}(0)$ to $\beta_{t-1}(3)$, inputted from the Iβ computation circuits 504 and 507 and from the registers 506, with a lead of one clock period.

That is, in this Iβ computation storage circuit 45, the selectors 505 and 508 selectively output, under control by the control signal ScB, the probabilities $\beta_t(0)$ to $\beta_t(3)$ or the initial values Iβa, Iβb to the registers 506 and 509, these probabilities $\beta_t(0)$ to Yt(3) being outputted by the Iβ computation circuits 504 and 507 with a lead of one clock period.

As the initial values Iβa and Iβb, the same value (such as 0 or log 1/M, herein log ¼) is usually given, as described above. When decoding the terminated code, log 1 (=0) and log 0 (=−∞) are given as the value in the terminated state and as the value in the other state, respectively.

Selectors 505 and 508 selectively output the initial values Iβa and Iβb to the registers 508 and 509 at a timing temporally ahead by one clock period at which the repetition of the first probability Iγ(β_1) and the second probability Iγ(β_2) is changed over with the time of the truncated length D times 2 or 2D as a unit in association with the repetition of the first probability Iγ(β_1) and the second probability Iγ(β_2) retrograding down time axis with the time of 2D as a unit (FIGS. 28A, 28B, 28D and 28E). For other timings, probabilities $\beta_t(0)$ to $\beta_t(3)$, outputted by the Iβ computation circuits 504 and 507, with a lead of one clock period, are outputted selectively.

The RAMs 513 and 514 are formed by a bank configuration having a capacity of storing the probabilities $\beta_{t-1}(0)$ to $\beta_{t-1}(3)$ in an amount corresponding to the truncated length. From the probabilities $\beta_{t-1}(0)$ to $\beta_{t-1}(3)$, outputted by the Iβ computation circuits 504 and 507 with a shift equal to the truncated length times 2, that is 2D, obtained in terms of a truncated length times 2, that is 2D, as a period (FIGS. 28B to 28D), the probabilities $\beta_{t-1}(0)$ to $\beta_{t-1}(3)$, obtained for the latter truncated length, are inputted sequentially and cyclically. Thus, from the two channels of the probabilities βt−1(0) to βt−1(3), computed from the initial values Iβa and Iβb, as reference, the RAMs 513 and 514 selectively retrieve sufficiently reliable portions to output the so-stored $\beta_{t-1}(0)$ to $\beta_{t-1}(3)$ chronologically.

The Iβ computation storage circuit 45 processes the first probability Iγ simultaneously in parallel by plural channels, within the extent of the truncated length in question as from each reference time point as set for at least the first probability Iγ to compute the third probability Iβ by plural channels to output selectively the probability Iβ of the truncated length by these plural channels of the probabilities Iγ. Meanwhile, in the preferred embodiment, these reference time points are set at the terminal point of the truncated length next to each truncated length.

The selection circuit 510 output the probabilities $\beta_{t-1}(0)$ to $\beta_{t-1}(3)$, alternatively outputted from the RAMs 513 and 514 in this sequence in terms of the truncated length D as a unit, to the soft output computation circuit 15.

In the above structure, an input it is convolution-encoded with a constraint length 3, by the convolutional encoder 2, where $i_t$ is converted into an output string $X_t$ having a number of states m equal to 4, this output string $X_t$ being inputted to the decoder 4 over the non-storage communication route 3. In this decoder 4, the received value of the input signal is detected by analog/digital conversion and inputted to the Iγ computation storage circuit 43.

In the Iγ computation storage circuit 43, the probability of the received value $\beta_t$ associated with each state is computed by the table of the ROMs 302a to 302d, associated with each state (first term of the right side of the equation (16) and summmed to the initial value log Pr{$i_t$=0} by the adders 303a to 303d to compute sequentially the first probability Iγ associated with each state m (FIG. 26A).

The first probability Iγ, thus computed, is sequentially stored in the RAMs 304a to 304e of the bank configuration, constituted with the truncated length D as a unit, so as to be sequentially stored in the RAMs 304a to 304e of the bank structure constituted in terms of the truncated length D as a unit, and so as to be outputted chronologically to the Iγ computation storage circuit 42 after a delay corresponding to a time equal to the truncated length D times three (FIG. 26C). This outputs the first probability Iγ(α) to the Iγ computation storage circuit 43 in a sequence and timing proper for the processing by the Iγ computation storage circuit 43.

If the first probability Iγ is partitioned in terms of the truncated length D as a unit, each reference time point is set at a time point corresponding to the truncated length as from each truncated length D, and the first probability Iγ is stored in the RAMs 304a to 304e as from each truncated length to the corresponding reference time point, the partitioned portions of the first probability Iγ are outputted to the Iβ computation storage circuit 45 in a sequence retrograding down the time axis as from each reference time point (FIGS. 26D to G). Since the reference time point is set at an end time point of the next following truncated length, the partitioned portion of the first probability Iγ as from the next following truncated length up to the corresponding reference time point starts to be outputted, before completion of the outputting of the partitioned portion of the first probability Iγ as from a given truncated length up to the reference time point. Thus, the first probability Iγ is outputted to the Iβ computation storage circuit 45 in a sequence retrograding down the time axis by two routes shifted in contents and timing by one truncated length (see FIGS. 26D to G). This outputs two routes of the second probability Iγ($β_1$) in a sequence and at a timing suited to the processing in the Iβ computation storage circuit 45.

On the other hand, the first probability Iγ is chronologically outputted to the soft output computation circuit 46, with a pre-set time delay, in the same way as it is outputted to the computation storage circuit 44.

The Iα computation storage circuit 44 computes the second probability α(λ) of getting to each state from the first probability Iγ in a direction along the time axis for every received value to output the computed second probability α(λ) in a sequence and timing suited to processing in the soft output computation circuit 46.

In the Iβ computation storage circuit 45, the two routes of the input probabilities Iγ($β_1$) and Iγ($β_2$) in the retrogressive direction down the time axis are summed in the Iβ computation circuits 504 and 507 to the probabilities βt of the corresponding states one clock back and a smaller one of the summed values is selected to compute the probability for every state in the retrogressive direction down the time axis. By selectively feeding back the sequentially computed probabilities or the initial values Iβa and Iβb to the Iβ computation circuits 504 and 507 by the RAMs 304a and 304b, the probability in the direction retrograding from the reference time point is calculated simultaneously in parallel.

The two channels of the probabilities of the truncated length are selectively stored and outputted with sufficient reliability in an area remote from the reference point. At the time of selective outputting of the probability via the RAMs 513 and 514, these probabilities are re-arrayed in the sequence along the time axis reversed from that at the time of storage and are outputted to the soft output computation circuit 46. The third probability Iβ(λ) is outputted in a sequence corresponding to the processing in the soft output computation circuit 46 along the time axis.

The soft output computation circuit 46 can execute the processing without re-arraying the input probabilities Iα(λ) Iβ(λ) and Iγ(λ) and without re-arraying the computed soft outputs Iγ, thus enabling the soft outputs to be obtained by a simplified structure.

Since the third probability can be computed by computation of two states×number of states, instead of by computation of the constraint length×number of states, in decoding a symbol, the processing volume can be correspondingly reduced to simplify the entire structure.

That is, the probabilities Iα(λ) Iβ(λ) and Iγ(λ), inputted in this manner to the soft output computation circuit 46, are summed every corresponding state. The maximum value of these probabilities is detected every time the value "1" or the value "0" is entered and is processed by a subtractor 606 to give a soft output Iγ$_t$, which is outputted in a time sequence associated with the received value β$_t$.

Thus, by partitioning the first probabilities Iγ every truncated length D to set the corresponding reference time point, by outputting the probability Iγ of the truncated length from each reference time point as a unit by plural channels in a direction retrograding down time axis, and by outputting the first, second and third probabilities Iγ, Iα and Iγ in a sequence proper to the next following processing, the soft output of each symbol can be obtained by the computation of two channels×number of states in place of the computation of the constraint length×number of states. At this time, the soft output computation circuit is able to compute the soft output Iγ without re-arraying Iα and Iβ or the computed soft output Iγ. This enables the soft output to be decoded by a simplified structure.

In the above-described embodiment, the reference time point is set in terms of the truncated length as a unit. The present invention, however, is not limited to this embodiment since the reference time point can be optionally set to various positions. If, by the reference time point, thus set, the length as from a given reference time point up to a corresponding truncated length is longer than in the above-described embodiment, it becomes necessary to output the first probability Iγ via a corresponding number of channels and to process the outputted probabilities Iγ by corresponding channels in the Iγ computation storage circuit.

In the above-described embodiment, the soft output is computed by a truncated length equal to 4. The present invention, however, is not limited to this embodiment since the truncated length can be optionally set to any suitable value.

In the above-described embodiment, the convolutional encoding is effected with the constraint length equal to 3. The present invention, however, is not limited to this embodiment since the present invention can be applied to processing of convolutional codes by any suitable constraint length.

Also, in the above-described embodiment, the soft output is computed by the SW-Max-Log-BCJR algorithm. The present invention, however, is not limited to this embodiment since the present invention can be applied extensively to computation of the soft output by a variety of suitable soft output decoding algorithms, such as SW-Log-BCJR algorithm.

Thus, according to the present invention, in which the probability information is stored in an amount not less than the truncated length D and the updating of the probability information within the truncated length and the computation of the soft output outside the truncated length are carried out in parallel, the volume of computations per clock and the volume of accessing per memory can be reduced significantly to expedite the decoding of the convolutional codes. Moreover, by computing and processing the probabilities leading to respective states in a direction retrograding down the time axis with a length not less than the truncated length as a unit over plural channels to compute the soft output, and by outputting the computed probabilities in a sequence suited to the next following computation, a soft output decoding method and apparatus can be realized in which the soft output can be decoded by a simplified configuration.

What is claimed is:

1. A soft output decoding apparatus for convolutional codes, comprising:

probability computing means for finding probability information in each transition state of the convolutional codes;

probability storage means for storing the probability information as found by the probability computing means in a recording medium; and soft output computing means for finding a soft output using the probability information stored in said recording medium; wherein:

the probability storage means stores the probability information in an amount not less than a truncated length on said recording medium;

an updating of the probability information within the truncated length by the probability storage means occurs in parallel with the computation of the soft output outside the truncated length by the soft output computing means.

2. The soft output decoding apparatus according to claim 1, wherein the probability computing means and the soft output computing means compute a product processing of the probabilities by logarithmic addition processing to compute an addition processing of the probabilities by logarithmic maximum value processing.

3. The soft output decoding apparatus according to claim 1, wherein the probability computing means and the soft output computing means compute a product processing of the probabilities by a logarithmic addition processing and a degree-one function processing to compute an addition processing of the probabilities by a logarithmic maximum value processing.

4. A soft output decoding apparatus for convolutional codes, comprising:

probability computing means for finding probability information in each transition state of the convolutional codes;

probability storage means for storing the probability information as found by the probability computing means in a recording medium; and soft output computing means for finding a soft output using the probability information stored in said recording medium; wherein:

the probability storage means stores the probability information in an amount not less than a truncated length on said recording medium;

an updating of the probability information within the truncated length by the probability storage means and the computation of the soft output outside the truncated length by the soft output computing means are carried out in parallel;

wherein said probability computing means comprises:

first computing means for computing a first probability as determined by a code output pattern and a received value;

second computing means for chronologically computing a second probability from the start of encoding up to each state for every received value, based on the first probability; and third computing means for computing a third probability for every received value from the truncation state up to each state in a sequence reversed from the chronological sequence, based on the first probability;

and wherein the probability information updated within the truncated length of the probability storage means is the third probability information.

5. The soft output decoding apparatus for convolutional codes according to claim 4, wherein the first computing means transiently stores the first probabilities in the probability storage means and sequentially reads out and outputs the first probabilities in a sequence corresponding to each processing in the soft output computation means; and wherein the third computing means:

partitions the first probabilities in terms of the pre-set truncated length as a unit;

sets the reference time point along the time axis direction as from the truncated length;

processes the first probabilities simultaneously and in parallel by plural channels, at least in terms of a length corresponding to the truncated length as from each reference time point as a unit, to compute the third probability;

selects the third probability corresponding to the truncated length from the computed third probabilities of the plural channels, to store the third probabilities corresponding to the received value transiently in the probability storage means; and sequentially reads out and outputs the third probabilities in a sequence corresponding to the processing by the soft output computation means.

6. The soft output decoding apparatus for convolutional codes according to claim 5, wherein:

the first probabilities transiently stored by the probability storage means are delayed a pre-set time in a sequence along the time axis, at least in terms of a length inclusive of the first probabilities of the truncated length corresponding to each reference time point;

the first probabilities are outputted simultaneously in parallel to the third computing means over plural channels in a sequence retrograding down the time axis; and the first probabilities transiently stored in the probability storage means are delayed a pre-set time in a direction along time axis and outputted to the soft output computation means.

7. The soft output decoding apparatus for convolutional codes according to claim 5, wherein the reference time point is set at an end time point of the next following truncated length.

8. The soft output decoding apparatus according to claim 4, wherein the probability computing means and the soft output computing means compute a product processing of the probabilities by a logarithmic addition processing to compute an addition processing of the probabilities by a logarithmic maximum value processing.

9. The soft output decoding apparatus according to claim 4, wherein the probability computing means and the soft output computing means compute a product processing of the probabilities by a logarithmic addition processing and a degree-one function processing to compute an addition processing of the probabilities by a logarithmic maximum value processing.

10. A soft output decoding method for convolutional codes comprising:

a first step of finding probability information at each transition state of the convolutional codes;

a second step of storing the probability information in a recording medium in a length not less than a truncated length; and a third step of finding a soft output using probability information stored in the recording medium in second step; wherein:

an updating of the probability information within the truncated length in the second step is performed in parallel with the computation of the soft output outside the truncated length in the third step.

11. A soft output decoding method for convolutional codes, comprising:

a first probability computing step of sequentially computing, for each received value, a first probability as determined by an output pattern of a code and a received value;

a second probability computing step of computing, for each received value, a second probability of reaching each state in a direction along a time axis, based on the first probability;

a third probability computing step of computing, for each received value, a third probability of reaching each state in a direction retrograding down the time axis, as from a preset reference time point, based on the first probability; and a soft output computing step of computing a soft output based on the first, second and third probabilities; wherein in the third probability computing step, the first probability is partitioned in terms of the pre-set truncated length as a unit, the reference time point is set along the time axis direction as from said truncated length, the first probability is processed simultaneously in parallel by plural channels, at least in terms of a length corresponding to a truncated length as from each reference time point as a unit, to compute the third probabilities by plural channels, the third probability corresponding to said truncated length is selected from the computed plural channels of the third probability, and the third probability corresponding to the received value is outputted;

and wherein in the first probability computing step, the first probability is transiently held in probability storage means and sequentially read out and outputted in a sequence corresponding to each processing in the second and third probability computing steps and in the soft output computing step;

and the third probability is transiently held in a probability storage means during the third probability computing step and sequentially read out and outputted in a sequence corresponding to the processing in the soft output computing step.

12. The soft output decoding method for convolutional codes according to claim 11, wherein:

the first probability transiently held by the probability storage means is delayed a preset time in a sequence along the time axis, at least in terms of a length inclusive of the first probability of the truncated length corresponding to each reference time point as a unit; and wherein the first probability is outputted simultaneously in parallel to the third probability computing means over plural channels in a sequence retrograding down the time axis.

13. The soft output decoding method for convolutional codes according to claim 11, wherein the reference time point is set to an end point of the next following truncated length.

14. The soft output decoding method according to claim 11, wherein:

a product processing of the probabilities is computed by a logarithmic addition processing in the first, second and third probability computing steps and the soft output computing step; and an addition processing of said probabilities is computed by a logarithmic maximum value processing.

15. The soft output decoding method according to claim 11, wherein:

a product processing of said probabilities is computed by a logarithmic addition processing in the first, second and third probability computing sub-steps and the soft output computing step, and an addition processing of the probabilities is computed by a logarithmic maximum value processing and a degree-one function processing.

16. A soft output decoding apparatus for convolutional codes, comprising:

an input terminal which inputs a priori probability values and a received value;

a controller which generates control signals;

a first computation storage circuit which computes and stores a first probability for each received value, in accordance with the a priori probability values and the received value from the input terminal and a control signal from the controller;

a second computation storage circuit which computes and stores a second probability from an encoding state chronologically to each state from one received value to another, in accordance with the first probability from the first computation storage circuit and a control signal from the controller;

a third computation storage circuit which computes a third probability for every received value from a pre-set truncated length up to each state in a reverse chronological sequence, in accordance with the first probability from the first probability computation storage circuit and a control signal from the control circuit;

a soft output computation circuit which computes soft output values outside the truncated length in parallel with an updating of the probability information inside the truncated length, in accordance with the first probability from the first computation storage circuit, the second probability from the second computation storage circuit and the third probability from the third computation storage circuit; and an output terminal which outputs the soft output values.

17. The soft output decoding apparatus according to claim 16, wherein the first computation storage circuit, the second computation storage circuit, the third computation storage circuit and the soft output computation circuit compute a product processing of the probabilities by a logarithmic addition processing to compute an addition processing of the probabilities by a logarithmic maximum value processing.

18. The soft output decoding apparatus according to claim 16, wherein the first computation storage circuit, the second computation storage circuit, the third computation storage circuit and the soft output computation circuit compute a product processing of the probabilities by a logarithmic addition processing and a degree-one function processing to compute an addition processing of the probabilities by a logarithmic maximum value processing.

19. The soft output decoding apparatus according to claim 16, wherein:

the first computation storage circuit transiently stores the first probabilities and sequentially reads out and outputs the first probabilities in a sequence corresponding to the processing in the soft output computation circuit; and the third computation storage circuit:
  partitions the first probabilities in terms of the pre-set truncated length as a unit;
  sets the reference time point along the time axis direction as from the truncated length;
  processes the first probabilities simultaneously and in parallel by plural channels, in terms of a length corresponding to the truncated length as from each reference time point as a unit, to compute the third probability;
  selects the third probability corresponding to the truncated length from the computed third probabilities of the plural channels, to store the third probabilities corresponding to the received value transiently; and
  sequentially reads out and outputs the third probabilities in a sequence corresponding to the processing by the soft output computation circuit.

20. The soft output decoding apparatus according to claim 19, wherein:

the first probabilities transiently stored in the first computation storage circuit are delayed a pre-set time in a sequence along the time axis, at least in terms of a length inclusive of the first probabilities of the truncated length corresponding to each reference time point;

the first probabilities are outputted simultaneously and in parallel to the third computation storage circuit over plural channels in a sequence retrograding down the time axis; and the first probabilities transiently stored in the first computation storage circuit are delayed a pre-set time in a direction along a time axis and outputted to the soft output computation circuit.

21. The soft output decoding apparatus according to claim 19, wherein the reference time point is set at an end time point of the next following truncated length.

* * * * *